United States Patent
Okada

(10) Patent No.: US 11,094,915 B2
(45) Date of Patent: Aug. 17, 2021

(54) LIGHT EMITTING DEVICE INCLUDING BUS ELECTRODES CONFIGURED IN PARALLEL TO DIRECTLY CONTACT OLED ELECTRODES

(71) Applicant: PIONEER CORPORATION, Tokyo (JP)

(72) Inventor: Takeru Okada, Tokyo (JP)

(73) Assignee: PIONEER CORPORATION, Tokyo (JP)

( * ) Notice: Subject to any disclaimer, the term of this patent is extended or adjusted under 35 U.S.C. 154(b) by 0 days.

(21) Appl. No.: 16/469,491

(22) PCT Filed: Dec. 11, 2017

(86) PCT No.: PCT/JP2017/044336
§ 371 (c)(1),
(2) Date: Jun. 13, 2019

(87) PCT Pub. No.: WO2018/110491
PCT Pub. Date: Jun. 21, 2018

(65) Prior Publication Data
US 2020/0119308 A1   Apr. 16, 2020

(30) Foreign Application Priority Data
Dec. 13, 2016   (JP) .............................. JP2016-241026

(51) Int. Cl.
*H01L 51/52* (2006.01)
*H01L 27/32* (2006.01)

(52) U.S. Cl.
CPC ...... *H01L 51/5256* (2013.01); *H01L 27/3202* (2013.01); *H01L 51/5206* (2013.01)

(58) Field of Classification Search
CPC ............ H01L 51/5256; H01L 51/5206; H01L 27/3202
See application file for complete search history.

(56) References Cited

U.S. PATENT DOCUMENTS 6,693,296 B1   2/2004   Tyan
8,921,846 B2   12/2014  Nishikawa et al.
(Continued)

FOREIGN PATENT DOCUMENTS

JP   H11-040354 A   2/1999
JP   2004-071570 A  3/2004
(Continued)

OTHER PUBLICATIONS

International Search Report for related International Application No. PCT/JP2017/044336, dated Mar. 6, 2018; 2 pages.

Primary Examiner — Matthew E. Gordon
(74) Attorney, Agent, or Firm — Procopio, Cory, Hargreaves & Savitch LLP

(57) ABSTRACT

A light emitting device (10) includes a plurality of light emitting portions (140) and an inorganic layer (200). Each light emitting portion (140) has an anode (110), an organic layer (120), and a cathode (130). The inorganic layer (200) spreads over the plurality of light emitting portions (140), and continuously covers the plurality of light emitting portions (140). Thus, the inorganic layer (200) seals the plurality of light emitting portions (140). The organic layers (120) of the respective light emitting portions (140) are spaced apart from each other. Similarly, the cathodes (130) of the respective light emitting portions (140) are spaced apart from each other.

16 Claims, 23 Drawing Sheets

(56) References Cited

U.S. PATENT DOCUMENTS

| | | |
|---|---|---|
| 9,219,101 B2 | 12/2015 | Hayashi |
| 9,386,656 B2 | 7/2016 | Tanaka et al. |
| 2004/0031957 A1* | 2/2004 | Tyan .................. H01L 27/3209 |
| | | 257/40 |
| 2011/0037054 A1 | 2/2011 | Shieh et al. |
| 2011/0163337 A1 | 7/2011 | Shiang et al. |
| 2012/0205634 A1* | 8/2012 | Ikeda .................. H01L 51/5206 |
| | | 257/40 |
| 2012/0205675 A1* | 8/2012 | Yamazaki ........... H01L 27/3202 |
| | | 257/88 |
| 2013/0285033 A1 | 10/2013 | Nishikawa et al. |
| 2014/0353657 A1 | 12/2014 | Hayashi |
| 2015/0035445 A1 | 2/2015 | Tanaka et al. |

FOREIGN PATENT DOCUMENTS

| | | |
|---|---|---|
| JP | 2009-211948 A | 9/2009 |
| WO | 2012/093671 A1 | 7/2012 |
| WO | 2013/125436 A1 | 8/2013 |

* cited by examiner

LIGHT EMITTING DEVICE INCLUDING BUS ELECTRODES CONFIGURED IN PARALLEL TO DIRECTLY CONTACT OLED ELECTRODES

CROSS-REFERENCE TO RELATED APPLICATIONS

This application is a U.S. National Stage entry of PCT Application No: PCT/JP2017/044336 filed Dec. 11, 2017, which claims priority to Japanese Patent Application No. 2016-241026, filed Dec. 13, 2016, the contents of which are incorporated herein by reference.

TECHNICAL FIELD

The present invention relates to a light emitting device.

BACKGROUND ART

In recent years, an organic light emitting diode (OLED) has been developed as a light emitting device. The OLED has a light emitting portion, and the light emitting portion has a first electrode, an organic layer, and a second electrode. The organic layer includes a light emitting layer that emits a light by organic electroluminescence. The light emitting layer emits light by a voltage between the first electrode and the second electrode.

In the OLED, as described in Patent Document 1, a dark spot may be formed in some cases. Particularly, Patent Document 1 describes that when the second electrode is configured with a material having a low work function, the second electrode is oxidized due to an intrusion of moisture or oxygen to form the dark spot. Further, Patent Document 1 describes that the dark spot spreads with a lapse of time.

Patent Document 1 describes an example of a method of suppressing spreading of a dark spot. Specifically, the OLED described in Patent Document 1 includes a first electrode, a plurality of organic layers, a plurality of second electrodes, and a partition wall. The partition wall is located on the first electrode. The plurality of organic layers and the plurality of second electrodes are isolated from each other by the partition wall.

On the other hand, in the OLED, as described in Patent Document 2, a short circuit may occur between a first electrode and a second electrode. Particularly, Patent Document 2 describes that a short circuit between the first electrode and the second electrode is caused by particles when manufacturing is in progress.

Patent Document 2 describes that by connecting in series a plurality of light emitting portions and connecting in parallel each of columns including the plurality of light emitting portions connected in series, robustness to the above-described particles can be enhanced. Under this configuration, even if one of the light emitting portions in any of the columns is short-circuited, only the column including the short-circuited light emitting portion is isolated from the other columns.

RELATED DOCUMENT

Patent Document

[Patent Document 1] Japanese Unexamined Patent Application Publication No. H11-40354

[Patent Document 2] United States Patent Application Publication No. 2011/0163337

SUMMARY OF THE INVENTION

Technical Problem

As mentioned above, a dark spot may occur in the OLED. It is desirable that a range affected by the dark spot is as narrow as possible.

An example of the problem to be solved by the present invention is to limit a range affected by a dark spot to a limited range.

Solution to Problem

The invention described in claim 1 is a light emitting device including:

a first light emitting portion including a first organic layer between a first anode and a first cathode;

a second light emitting portion including a second organic layer between a second anode and a second cathode spaced apart from the first cathode, the second organic layer being spaced apart from the first organic layer;

a first conductive layer connected to the first cathode;

a second conductive layer connected to the second cathode;

a conductive layer connected to the first conductive layer and the second conductive layer; and an inorganic layer continuously covering the first light emitting portion, the second light emitting portion, and the conductive layer, the inorganic layer being in contact with the first conductive layer between the first cathode and the conductive layer.

BRIEF DESCRIPTION OF THE DRAWINGS

The foregoing and other objects, and features and advantages will become more apparent from the following description of preferred exemplary embodiments and the accompanying drawings.

DESCRIPTION OF EMBODIMENTS

Figure 1:
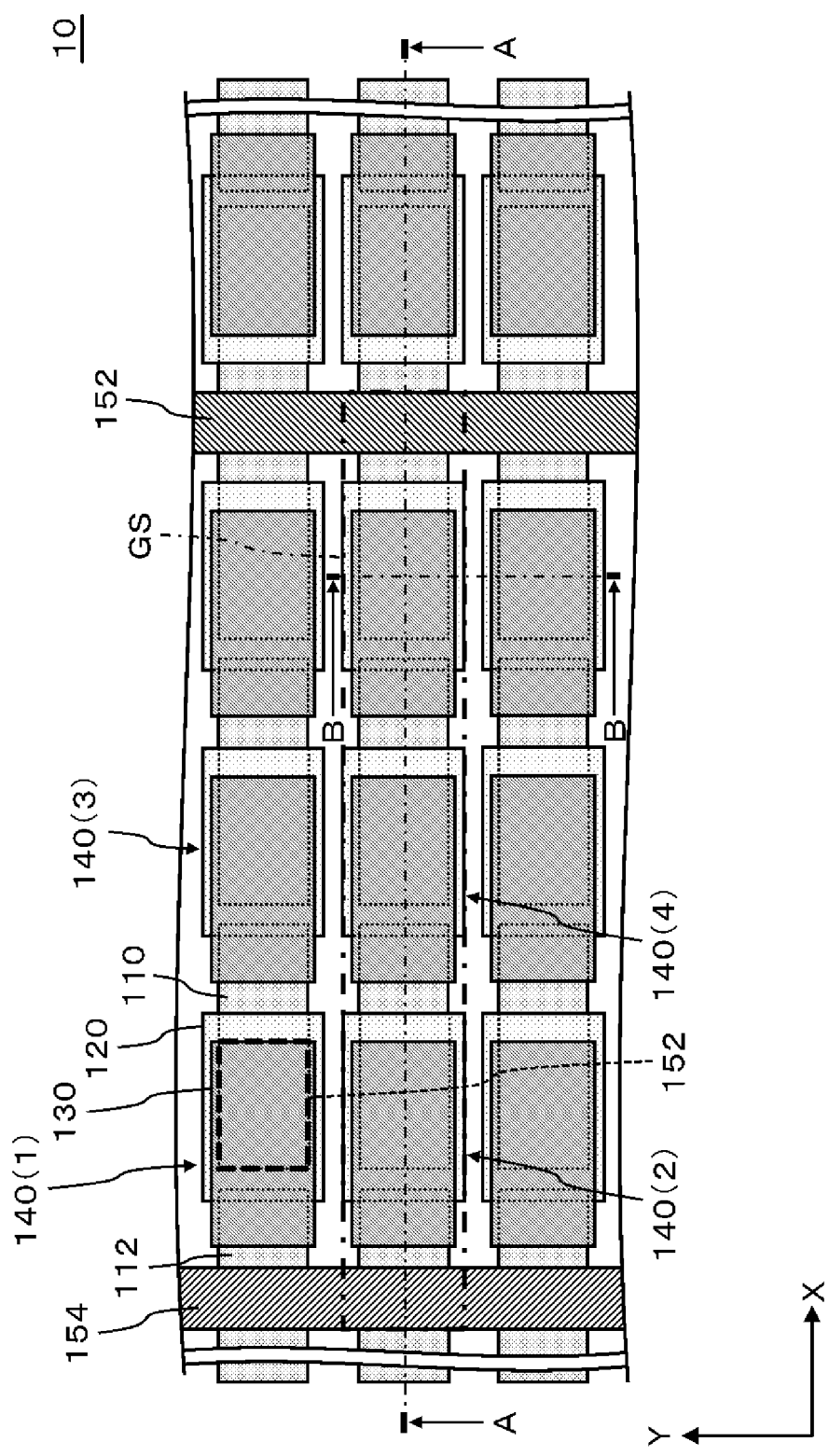
FIG. 1 is a plan view showing a light emitting device according to a first embodiment.

Hereinafter, embodiments of the present invention will be described with reference to the drawings. In all the drawings, similar components are denoted by the same reference numerals, and the description thereof will be omitted as appropriate.

First Embodiment

Figure 2:
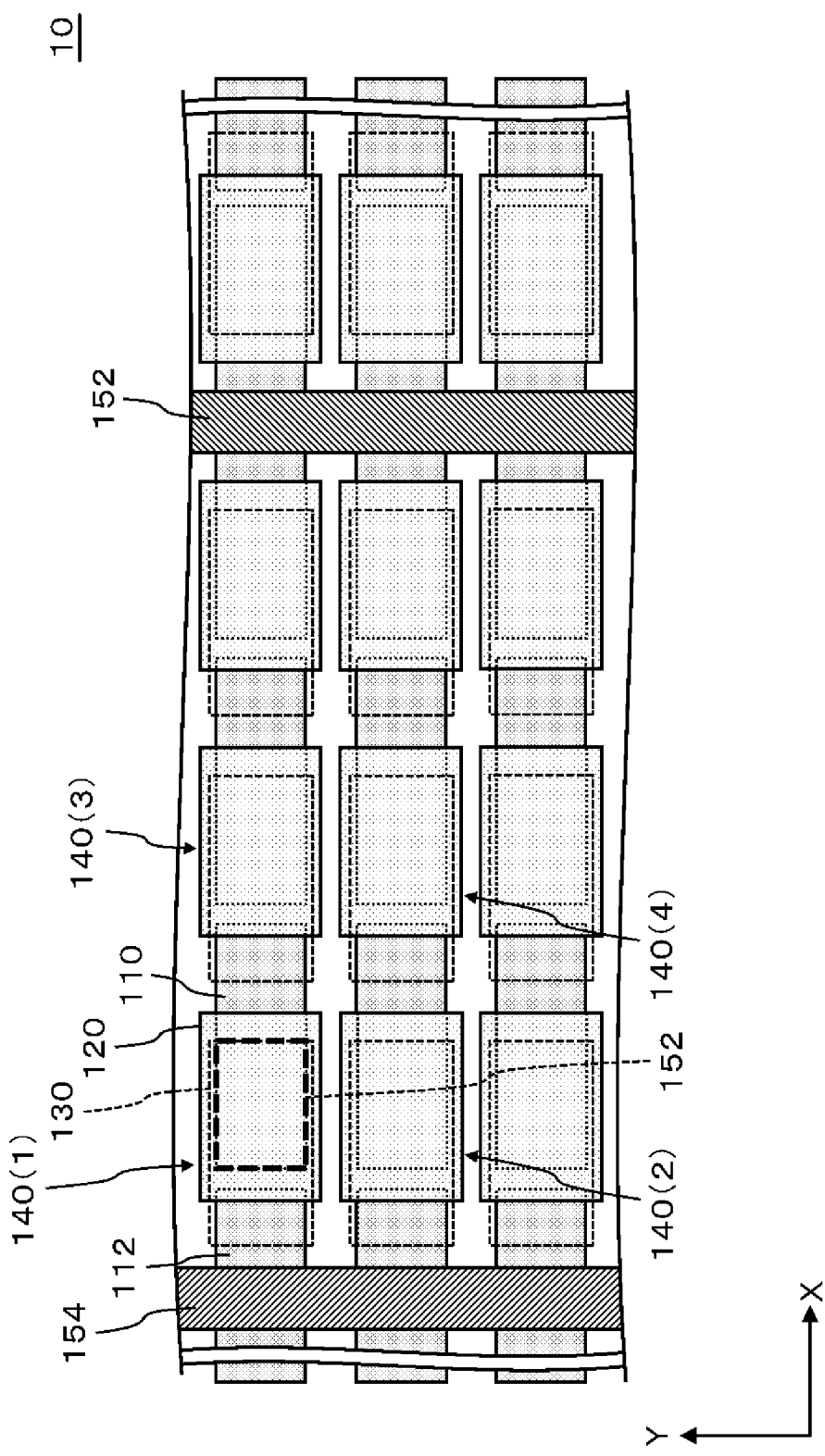
FIG. 2 is a view in which cathodes are removed from FIG. 1.
Figure 3:
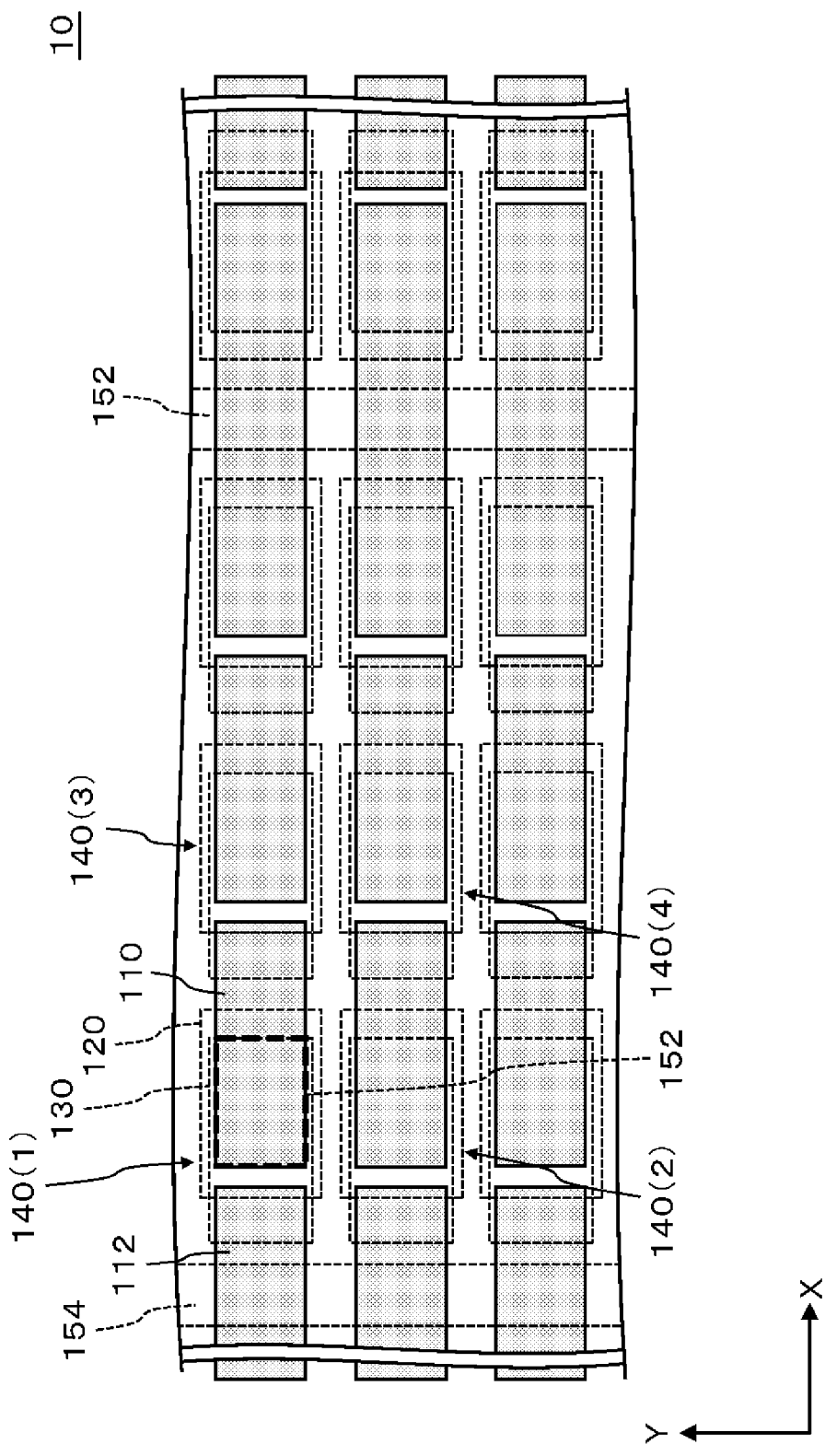
FIG. 3 is a view in which organic layers and bus electrodes are removed from FIG. 2.
Figure 4:
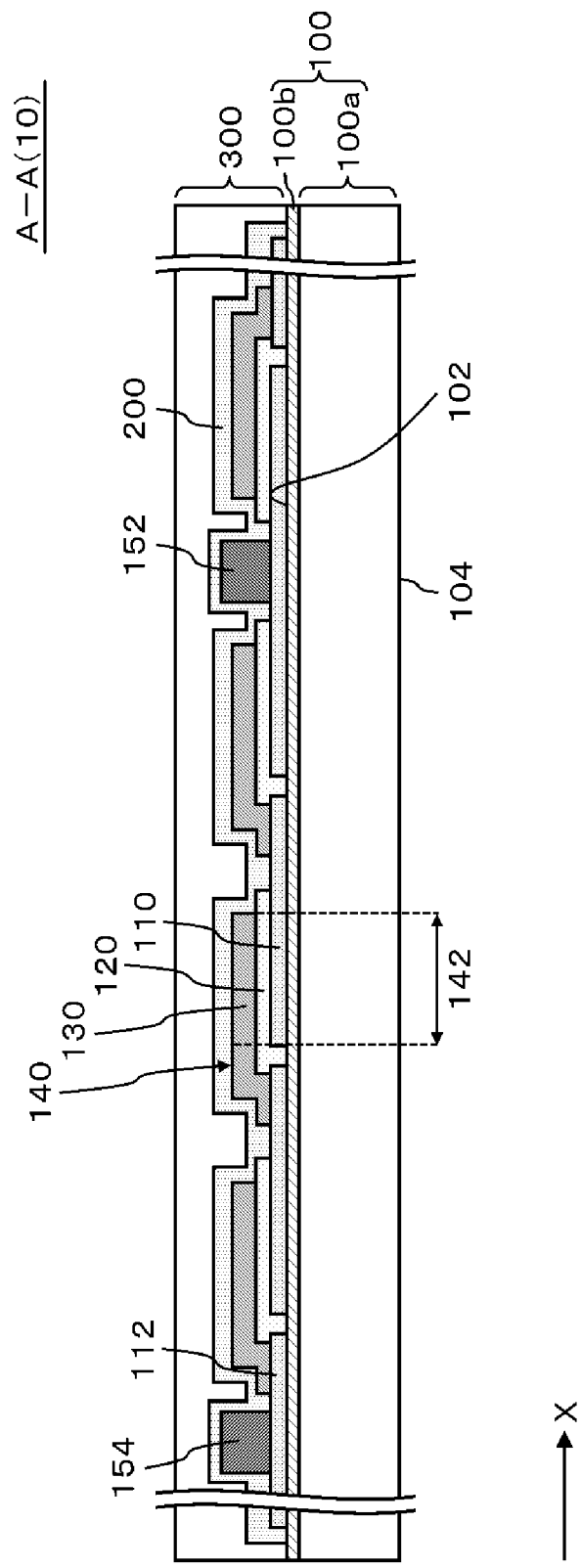
FIG. 4 is a cross-sectional view taken along line A-A in FIG. 1.
Figure 5:
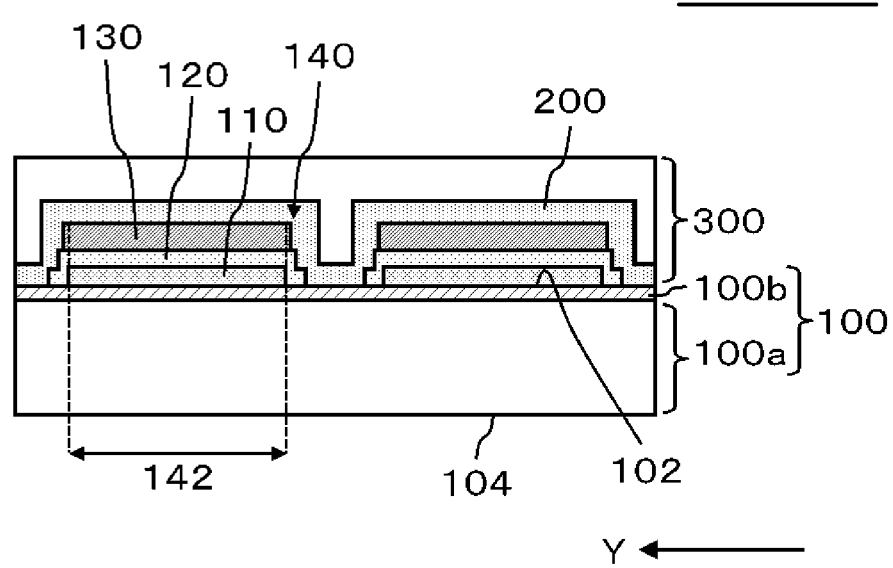
FIG. 5 is a cross-sectional view taken along line B-B in FIG. 1.

FIG. 1 is a plan view showing a light emitting device 10 according to a first embodiment. FIG. 2 is a view in which cathodes 130 are removed from FIG. 1. FIG. 3 is a view in which organic layers 120, bus electrodes 152, and bus electrodes 154 are removed from FIG. 2. FIG. 4 is a cross-sectional view taken along a line A-A in FIG. 1. FIG. 5 is a cross-sectional view taken along a line B-B in FIG. 1. Note that for the sake of explanation, in FIG. 1, an inorganic layer 200 and a protective layer 300 shown in FIGS. 4 and 5 are not shown.

An outline of the light emitting device 10 will be described with reference to FIGS. 1 to 5. The light emitting device 10 includes a plurality of light emitting portions 140 and an inorganic layer 200. Each light emitting portion 140 has an anode 110, an organic layer 120, and a cathode 130. The inorganic layer 200 spreads over the plurality of light emitting portions 140, and continuously covers the plurality of light emitting portions 140. Thus, the inorganic layer 200 seals the plurality of light emitting portions 140. The organic layers 120 of the respective light emitting portions 140 are spaced apart from each other. Similarly, the cathodes 130 of the respective light emitting portions 140 are spaced apart from each other.

By spacing apart the organic layers 120 of the respective light emitting portions 140 from each other and spacing apart the cathodes 130 of the respective light emitting portions 140, a range affected by a dark spot can be limited to a limited range. Specifically, a dark spot can spread by propagation of moisture. In contrast, when the organic layers 120 of the respective light emitting portions 140 are spaced apart from each other and the cathodes 130 of the respective light emitting portions 140 are spaced apart from each other, the moisture intruding into one light emitting portion 140 is prevented from propagating to another light emitting portions 140 through the organic layer 120 or the cathode 130.

The light emitting device 10 includes a plurality of element groups GS. Each element group GS includes a plurality of light emitting portions 140 connected in series. The plurality of element groups GS is connected in parallel.

By connecting the plurality of light emitting portions 140 in series inside each element group GS and connecting the plurality of element groups GS in parallel, a range of non-light emitting region due to a dark spot can be limited to a limited range. More specifically, as will be described later with reference to FIG. 6, even if a dark spot occurs in one light emitting portion 140 in any of the element groups GS and this light emitting portion 140 is opened, current can flow through the element group GS connected in parallel to the element group GS including the opened light emitting portion 140. That is, a range of a non-light emitting region due to a dark spot is limited to the opened light emitting portion 140 and the light emitting portion 140 connected in series with the opened light emitting portion 140.

By connecting the plurality of light emitting portions 140 in series inside each element group GS and connecting the plurality of element groups GS in parallel, a range of non-light emitting region due to a leakage can be limited to a limited range. More specifically, as will be described later with reference to FIG. 7, even if a leakage occurs in one light emitting portion 140 in any of the element groups GS and this light emitting portion 140 is short-circuited, current can flow through the light emitting portions 140 connected in series to the short-circuited light emitting portion 140 and the element group GS connected in parallel to the element group GS including the short-circuited light emitting portion 140. That is, a range of a non-light emitting region due to a dark spot is limited to the short-circuited light emitting portion 140.

Next, a plan layout of the light emitting device 10 will be described in detail with reference to FIGS. 1 to 3. The light emitting device 10 includes a conductive layer 112, a plurality of light emitting portions 140, a bus electrode 152, and a bus electrode 154. In FIGS. 1 to 3, an X direction is defined as an array direction of the bus electrode 152 and the bus electrode 154, and a Y direction is defined as an extending direction of the bus electrode 152 and the bus electrode 154. The Y direction intersects in the X direction, more specifically, it is orthogonal to the X direction. Each of the bus electrode 152 and the bus electrode 154 is a conductive layer.

The plurality of light emitting portions 140 is arranged in a two-dimensional matrix shape along the X direction and the Y direction. Particularly, in the examples shown in FIGS. 1 to 3, the plurality of light emitting portions 140 includes nine light emitting portions 140 arranged in a two-dimensional matrix shape of three rows and three columns between the bus electrode 152 and the bus electrode 154. The nine light emitting portions 140 are classified into three element groups GS. The three element groups GS are arranged in the Y direction, and each element group GS includes three light emitting portions 140 arranged in the X direction.

The light emitting portions 140 in each element group GS are connected in series (for example, a first light emitting portion 140 (1) and a third light emitting portion 140 (3), or a second light emitting portion 140 (2) and a fourth light emitting portion 140 (4), in FIGS. 1 to 3).

The three element groups GS are connected in parallel. In particular, a light emitting portion 140 adjacent to the bus electrode 154 in each element group GS is connected to the bus electrode 152 through the anode 110, and a light emitting portion 140 adjacent to the bus electrode 152 in each element group GS (for example, the first light emitting portion 140 (1) or the second light emitting portion 140 (2), in FIGS. 1 to 3) is connected to the conductive layer 112 through the conductive layer 112.

In the examples shown in FIGS. 1 to 3, as shown in FIG. 3, the anodes 110 adjacent to each other in the Y direction are not connected and are spaced apart from each other. Thereby, the area of a region overlapping with the anodes 110 can be reduced, and a light transmittance of the light emitting device 10 can be increased.

Similarly, the conductive layers 112 adjacent in the Y direction are not connected and are spaced apart from each other. Thereby, the area of a region overlapping with the conductive layers 112 can be reduced, and a light transmittance of the light emitting device 10 can be increased.

Each light emitting portion 140 has a pixel 142. In the pixel 142, the anode 110, the organic layer 120 and the cathode 130 are overlapped, and a light is emitted from the organic layer 120 by a voltage between the anode 110 and the cathode 130. In the example shown in FIG. 1, the shape of the pixel 142 is rectangular.

In the examples shown in FIGS. 1 to 3, the light emitting device 10 has a light transmitting portion in a region not overlapping a light shielding member (specifically, the cathodes 130, the bus electrode 152, and the bus electrode 154). That is, the light emitting device 10 has the light transmitting portion between the light emitting portions 140 adjacent along the X direction (for example, the first light emitting portion 140 (1) and the third light emitting portion 140 (3), or the second light emitting portion 140 (1) and the fourth light emitting portion 140 (2) in FIGS. 1 to 3) and between the light emitting portions 140 adjacent along the Y direction (for example, the first light emitting portion 140 (1) and the second light emitting portion 140 (2), or the third light emitting portion 140 (3) and the fourth light emitting portion 140 (4) in FIGS. 1 to 3).

Next, with reference to FIG. 4, a cross-sectional structure of the light emitting device 10 will be described in detail. The light emitting device 10 includes a substrate 100, the anode 110, the conductive layer 112, the organic layer 120, the cathode 130, the bus electrode 152, the bus electrode 154, the inorganic layer 200, and the protective layer 300.

The substrate 100 has a light transmitting property and includes a supporting substrate 100a and a barrier layer 100b. The substrate 100 has a first surface 102 and a second surface 104. The anode 110, the conductive layer 112, the organic layer 120, the cathode 130, the bus electrode 152, the bus electrode 154, the inorganic layer 200 and the protective layer 300 are located on the first surface 102 of the substrate 100. The second surface 104 is opposite to the first surface 102. The supporting substrate 100a is located at the second surface 104 side, and the barrier layer 100b is located at the first surface 102 side.

In one example, the supporting substrate 100a is a glass substrate. In another example, the supporting substrate 100a may be a resin substrate, specifically a polyethylene naphthalate (PEN) substrate (thickness: 100 μm, for example) or a transparent polyimide film (thickness: 20 μm, for example).

The barrier layer 100b is an inorganic layer, specifically, for example, a SiON film. The barrier layer 100b is provided to block moisture from the supporting substrate 100a. For example, the inorganic layer is a sputtered film (that is, a film formed by sputtering), a chemical vapor deposition (CVD) film (that is, a film formed by CVD), or an atomic layer deposition (ALD) film (that is, a film formed by ALD). In one example, a layer formed by ALD may be laminated on a layer formed by sputtering. Further, another inorganic layer may be further laminated on the inorganic layer through an organic layer. This organic layer is provided for smoothing. In one example, the organic layer can be formed by coating an organic material (for example, an epoxy resin, an acrylic resin, or a polyimide resin) with slit coating and firing the organic material. Another organic layer and another inorganic layer may be further laminated on the inorganic layer on the organic layer. In other words, the barrier layer 100b may include a plurality of inorganic layers and a plurality of organic layers which are alternately laminated.

The anode 110 has a light transmitting property. The anode 110 contains, for example, at least one of indium tin oxide (ITO), indium zinc oxide (IZO), and aluminum doped zinc oxide (AZO).

The conductive layer 112 has a light transmitting property. The conductive layer 112 contains the same material as the anode 110. That is, the conductive layer 112 can be formed in the same step as the anode 110. However, the conductive layer 112 may contain a material different from that of the anode 110.

The organic layer 120 emits a light by organic electroluminescence. The organic layer 120 includes, for example, a hole injection layer, a hole transport layer, a light emitting layer, an electron transport layer, and an electron injection layer.

The cathode 130 has a light blocking property, specifically, a light reflecting property. The cathode 130 contains, for example, at least one of Al, Ag, and Mg, or an alloy thereof.

The bus electrode 152 has conductivity. The bus electrode 152 can be, for example, Mo/Al/Mo (MAM).

The bus electrode 154 has conductivity. The bus electrode 154 contains the same material as the bus electrode 152. That is, the bus electrode 154 can be formed in the same step as the bus electrode 152. However, the bus electrode 154 may contain a material different from that of the bus electrode 152.

The inorganic layer 200 is an ALD film (that is, a film formed by ALD). The inorganic layer 200 is provided to seal the first surface 102 of the substrate 100, the anode 110, the organic layer 120, the cathode 130, the bus electrode 152, and the bus electrode 154. The inorganic layer 200 contains, for example, at least one selected from a group consisting of a $SiN_x$ layer, a SiON layer, an $Al_2O_3$ layer and a $TiO_2$ layer, and particularly, the inorganic layer 200 may include a laminated film thereof. Note that the inorganic layer 200 may be a CVD film (that is, a film formed by CVD).

The protective layer 300 is provided to protect the inorganic layer 200 from an external impact. The protective layer 300 can be, for example, a resin layer.

The light emitting device 10 includes a plurality of light emitting portions 140. Each light emitting portion 140 has an anode 110, an organic layer 120, and a cathode 130. The anodes 110 of the respective light emitting portions 140 are spaced apart from each other in the X direction, the organic layers 120 of the respective light emitting portions 140 are spaced apart from each other in the X direction, and the cathodes 130 of the respective light emitting portions 140 are spaced apart from each other in the X direction. This prevents moisture from propagating along the X direction from one light emitting portion 140 to another light emitting portion 140.

Each light emitting portion 140 has a pixel 142. In the pixel 142, the anode 110, the organic layer 120 and the cathode 130 are overlapped, and a light is emitted from the organic layer 120 by a voltage between the anode 110 and the cathode 130. In the example shown in FIG. 4, a light emitted from the organic layer 120 is transmitted through the anode 110 and is output from the substrate 100. However, in another example, a light emitted from the organic layer 120 may be transmitted through the cathode 130 and be output from the protective layer 300. In this case, the cathode 130 needs to have a light transmitting property.

The plurality of light emitting portions 140 between the bus electrode 152 and the bus electrode 154 is connected in series. Specifically, the anode 110 of the light emitting portion 140 adjacent to the bus electrode 152 is connected to the bus electrode 152. The cathode 130 of the light emitting portion 140 adjacent to the bus electrode 154 is connected to the bus electrode 154 through the conductive layer 112. The anode 110 and the cathode 130 of the light emitting portion 140 between these light emitting portions 140 are respectively connected to the cathode 130 of the light emitting portion 140 at the bus electrode 152 side and the anode 110 of the light emitting portion 140 at the bus electrode 154 side.

In each light emitting portion 140, an end portion of the anode 110 at the bus electrode 154 side is covered with the organic layer 120, an end portion of the organic layer 120 at the bus electrode 152 side is located on the anode 110 and is exposed from the cathode 130, and the end portion of the organic layer 120 at the bus electrode 154 side is covered with the cathode 130. This structure prevents a direct contact between the anode 110 and the cathode 130, that is, a short circuit between the anode 110 and the cathode 130.

In the example shown in FIG. 4, the light emitting portions 140 adjacent to each other across the bus electrode 152 share the common anode 110 and are connected to the common bus electrode 152. This can reduce a gap between the light emitting portions 140 adjacent across the bus electrode 152.

The organic layer 120 of one light emitting portion 140 except for the light emitting portion 140 adjacent to the bus electrode 154, spreads over the anode 110 of the one light emitting portion 140 and the anode 110 of another light emitting portion 140 at the bus electrode 154 side of the one light emitting portion 140, and is contact with the anode 110 of the another light emitting portion 140. Furthermore, a part of the organic layer 120 of the one light emitting portion 140 is buried in a gap between the anode 110 of the one light emitting portion 140 and the anode 110 of the another light emitting portion 140. In particular, in the example shown in FIG. 4, the part of the organic layer 120 of the one light emitting portion 140 is in contact with the first surface 102 of the substrate 100. This structure of the organic layer 120 can reduce a step on a surface of the cathode 130, and facilitates covering the cathode 130 with the inorganic layer 200. Furthermore, the above-described structure of the organic layer 120 enables the organic layer 120 to reliably cover the end portion of the anode 110 at the bus electrode 154 side, and prevents a direct contact between the anode 110 and the cathode 130, that is, a short circuit between the anode 110 and the cathode 130.

On the other hand, the organic layer 120 of the light emitting portion 140 adjacent to the bus electrode 154 spreads over the anode 110 of the light emitting portion 140 and the conductive layer 112, and is in contact with the conductive layer 112. Furthermore, a part of the organic layer 120 of the light emitting portion 140 is buried in a gap between the anode 110 and the conductive layer 112. In particular, in the example shown in FIG. 4, the part of the organic layer 120 is in contact with the first surface 102 of the substrate 100. This structure of the organic layer 120 can reduce a step on a surface of the cathode 130, and facilitates covering the cathode 130 with the inorganic layer 200. Furthermore, the above-described structure of the organic layer 120 enables the organic layer 120 to reliably cover the end portion of the anode 110 at the bus electrode 154 side, and prevents a direct contact between the anode 110 and the cathode 130, that is, a short circuit between the anode 110 and the cathode 130.

The inorganic layer 200 spreads over the plurality of light emitting portions 140. In particular, from the bus electrode 152 to the bus electrode 154, the inorganic layer 200 continuously covers the bus electrode 152, the plurality of light emitting portions 140, the conductive layer 112, and the bus electrode 154.

In particular, in the example shown in FIG. 4, the anode 110 connected to the bus electrode 152 includes a region overlapping with the bus electrode 152, and the bus electrode 152 is covered with the inorganic layer 200 opposite to the region of the anode 110. Further, the conductive layer 112 includes a region overlapping with the bus electrode 154, and the bus electrode 154 is covered with the inorganic layer 200 opposite to the region of the conductive layer 112.

The anode 110 of one light emitting portion 140 except the light emitting portion 140 adjacent to the bus electrode 152 includes a region overlapping with the cathode 130 of another light emitting portion 140 at the bus electrode 152 side of the one light emitting portion 140, and the cathode 130 of the another light emitting portion 140 is covered with the inorganic layer 200 opposite to the region of the anode 110. Further, the conductive layer 112 includes a region overlapping with the cathode 130 of the light emitting portion 140 adjacent to the bus electrode 152, and the cathode 130 is covered with the inorganic layer 200 opposite to the region of the conductive layer 112.

The inorganic layer 200 is in contact with the anode 110 between the cathode 130 of one light emitting portion 140 and the organic layer 120 of another light emitting portion 140 at the bus electrode 154 side of the one light emitting portion 140. That is, the cathode 130 of the one light emitting portion 140 and the organic layer 120 of the another light emitting portion 140 are isolated from each other across a part of the inorganic layer 200. This prevents the propagation of moisture between the cathode 130 of the one light emitting portion 140 and the organic layer 120 of the another light emitting portion 140.

Further, the inorganic layer 200 is in contact with the anode 110 between the organic layer 120 of the light emitting portion 140 adjacent to the bus electrode 152 and the bus electrode 152. That is, the organic layer 120 of the light emitting portion 140 and the bus electrode 152 are isolated from each other across a part of the inorganic layer 200. This prevents the propagation of moisture between the organic layer 120 of the light emitting portion 140 and the bus electrode 152.

Further, the inorganic layer 200 is in contact with the conductive layer 112 between the cathode 130 of the light emitting portion 140 adjacent to the bus electrode 154 and the bus electrode 154. That is, the cathode 130 of the light emitting portion 140 and the bus electrode 154 are isolated from each other across a part of the inorganic layer 200. This prevents the propagation of moisture between the cathode 130 of the light emitting portion 140 and the bus electrode 154.

Next, with reference to FIG. 5, a cross-sectional structure of the light emitting device 10 will be described in detail.

The anodes 110 of the respective light emitting portions 140 are spaced apart from each other in the Y direction, the organic layers 120 of the respective light emitting portions 140 are spaced apart from each other in the Y direction, and the cathodes 130 of the respective light emitting portions 140 are spaced apart from each other in the Y direction. This prevents moisture from propagating along the Y direction from one light emitting portion 140 to another light emitting portion 140.

In each light emitting portion 140, both ends of the anode 110 are covered with the organic layer 120. This structure prevents a direct contact between the anode 110 and the cathode 130, that is, a short circuit between the anode 110 and the cathode 130.

The inorganic layer 200 spreads over the plurality of light emitting portions 140, and continuously covers the plurality of light emitting portions 140.

The inorganic layer 200 is in contact with the first surface 102 of the substrate 100 between the organic layer 120 of one light emitting portion 140 and the organic layer 120 of another light emitting portion 140. That is, the organic layer 120 of the one light emitting portion 140 and the organic layer 120 of the another light emitting portion 140 are isolated from each other across a part of the inorganic layer 200. This prevents the propagation of moisture between the organic layer 120 of the one light emitting portion 140 and the organic layer 120 of the another light emitting portion 140.

Next, an example of a method of manufacturing the light emitting device 10 shown in FIGS. 1 to 5 will be described.

First, the anode 110 and the conductive layer 112 are formed on the first surface 102 of the substrate 100. The anode 110 and the conductive layer 112 can be formed by patterning using a photolithography. In particular, when the anode 110 and the conductive layer 112 contain the same material, the anode 110 and the conductive layer 112 can be formed in the same step.

Next, the bus electrode 152 and the bus electrode 154 are formed. The bus electrode 152 and the bus electrode 154 can be formed by patterning. In particular, when the bus electrode 152 and the bus electrode 154 contain the same material, the bus electrode 152 and the bus electrode 154 can be formed in the same step.

Next, the organic layer 120 is formed. The organic layer 120 can be formed by application, specifically by ink jet printing, or by evaporation, specifically by vacuum evaporation using a metal mask.

Next, the cathode 130 is formed. The cathode 130 can be formed by evaporation, specifically vacuum evaporation using a metal mask.

Next, the inorganic layer 200 is formed. In one example, the inorganic layer 200 can be formed by ALD. In another example, the inorganic layer 200 can be formed by CVD.

Next, the protective layer 300 is formed.

Thus, the light emitting device 10 shown in FIGS. 1 to 5 is manufactured.

FIG. 6 is a view for explaining a first example of operations of the light emitting device 10 shown in FIGS. 1 to 5.

In the example shown in FIG. 6, the light emitting device 10 includes two element groups GS connected in parallel. Each element group GS includes two light emitting portions 140 connected in series. Thus, the four light emitting portions 140 are arranged in a matrix shape of two rows and two columns. A resistance of each light emitting portion 140 is R. A voltage of the bus electrode 152 and the bus electrode 154 is V.

Figure 6A:
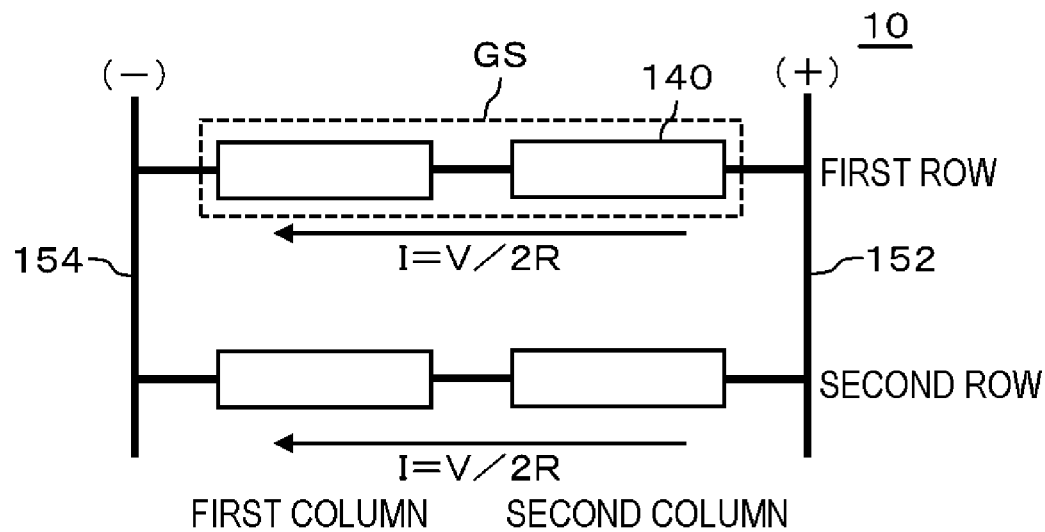
FIG. 6 is a view for explaining a first example of operations of the light emitting device shown in FIGS. 1 to 5.

In FIG. 6A, the light emitting device 10 operates normally. In particular, in the example shown in FIG. 6A, current of V/2R flows through the two light emitting portions 140 located in a first row, and current of V/2R also flows through the two light emitting portions 140 located in a second row.

Figure 6B:
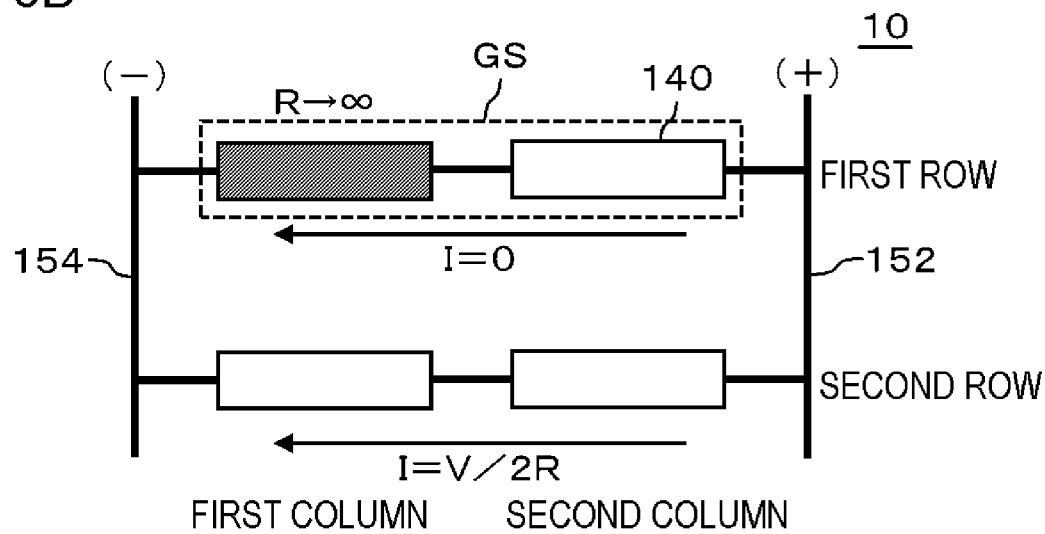

In FIG. 6B, a dark spot has occurred in the light emitting portion 140 located in a first row and a first column. Due to the occurrence of a dark spot, this light emitting portion 140 is opened. Although the current does not flow to the light emitting portion 140 connected in series to the opened light emitting portion 140 due to the opening of the light emitting portion 140, the same current (V/2R) as the current before the occurrence of a dark spot, flows through the element group GS connected in parallel to the element group GS including the opened light emitting portion 140.

FIG. 7 is a view for explaining a second example of operations of the light emitting device 10 shown in FIGS. 1 to 5. The example shown in FIG. 7 is the same as the example shown in FIG. 6, except for the following points.

Figure 7A:
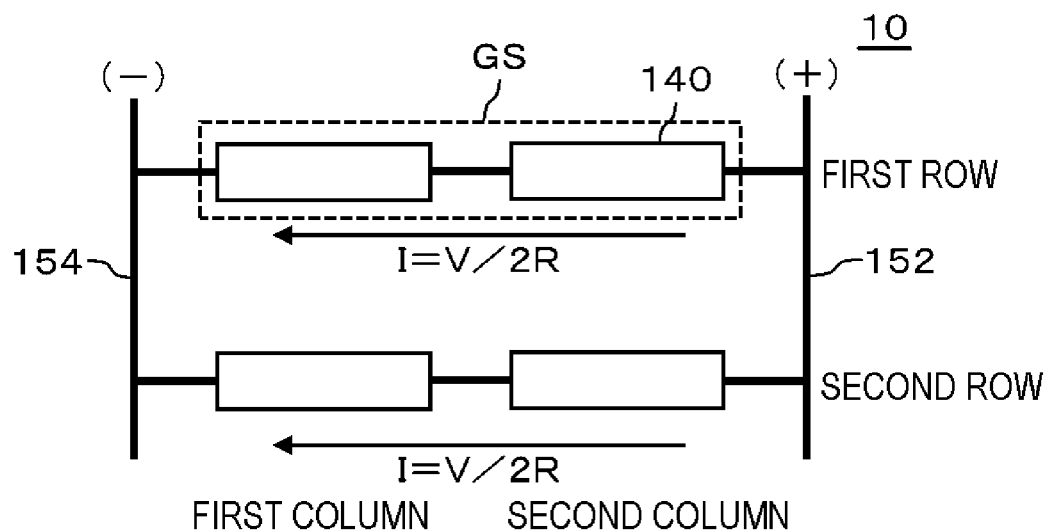
FIG. 7 is a view for explaining a second example of operations of the light emitting device shown in FIGS. 1 to 5.

In FIG. 7A, the light emitting device 10 operates normally. In particular, in the example shown in FIG. 7A, current I=V/2R flows through the two light emitting portions 140 located in a first row, and current I=V/2R also flows through the two light emitting portions 140 located in a second row.

Figure 7B:
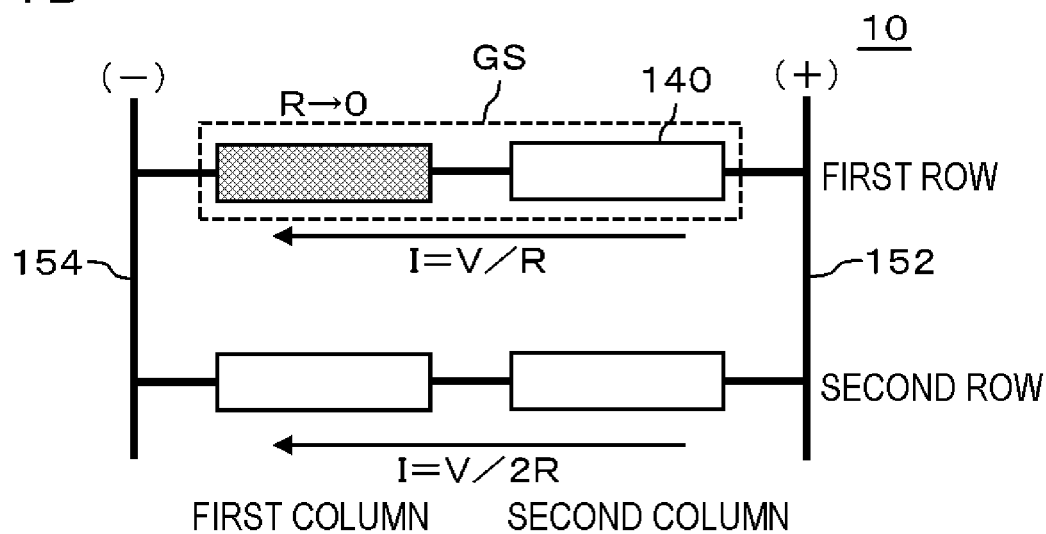

In FIG. 7B, a leakage has occurred in the light emitting portion 140 located in a first row and a first column. Due to the occurrence of the leakage, this light emitting portion 140 is short-circuited. Although the current flowing through the light emitting portion 140 connected in series to the short-circuited light emitting portion 140 increases due to the leakage of the light emitting portion 140, the current flows through any of the light emitting portions 140. In particular, in the example shown in FIG. 7B, the current flowing through each light emitting portion 140 located in the first row is V/R. On the other hand, the current flowing through the light emitting portions 140 located in the second row remains V/2R.

As described above, according to the present embodiment, a range affected by a dark spot can be limited to a limited range.

Furthermore, according to the present embodiment, a range of the non-light emitting region due to a dark spot or a leakage can be limited to a limited range.

Second Embodiment

Figure 8:
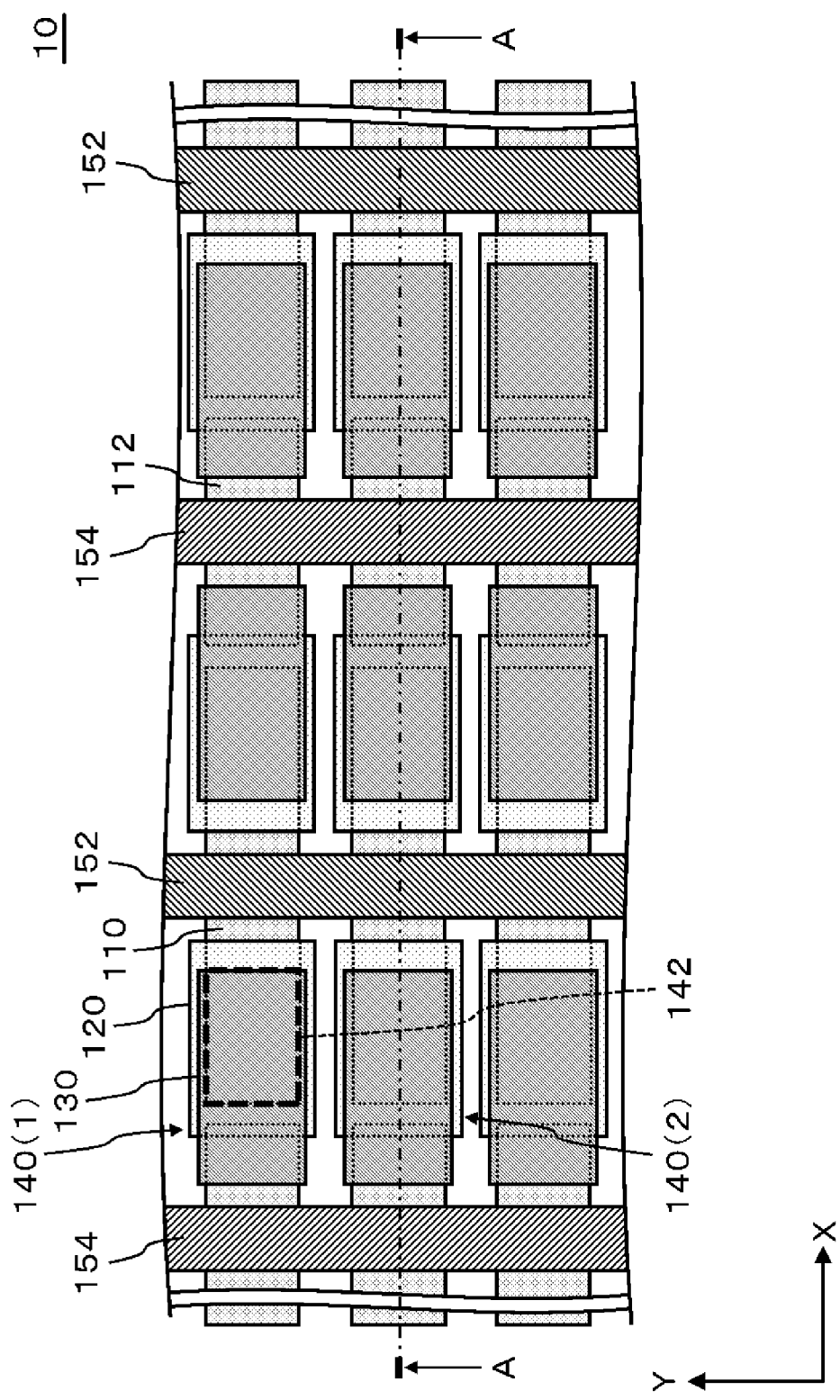
FIG. 8 is a plan view showing a light emitting device according to a second embodiment.
Figure 9:
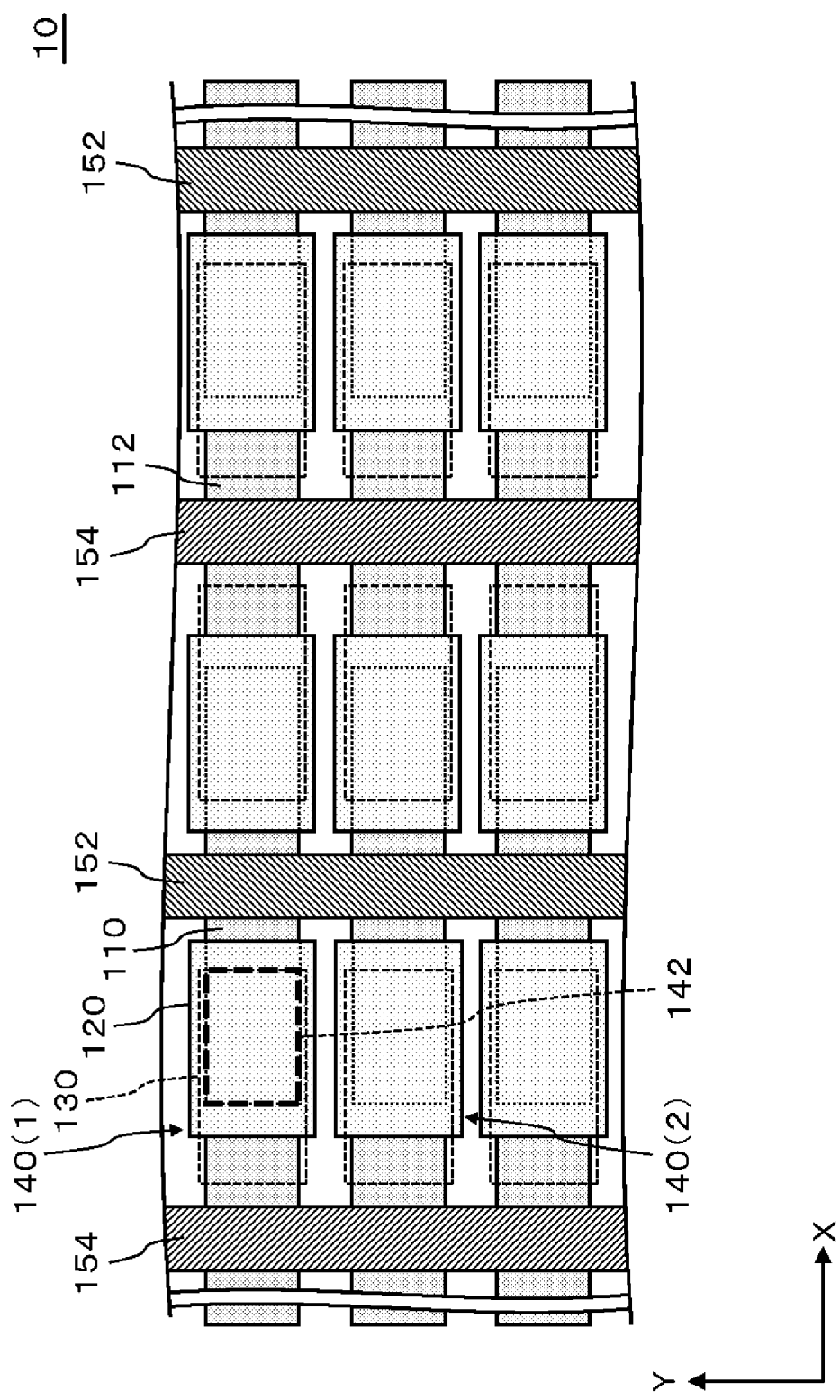
FIG. 9 is a view in which cathodes are removed from FIG. 8.
Figure 10:
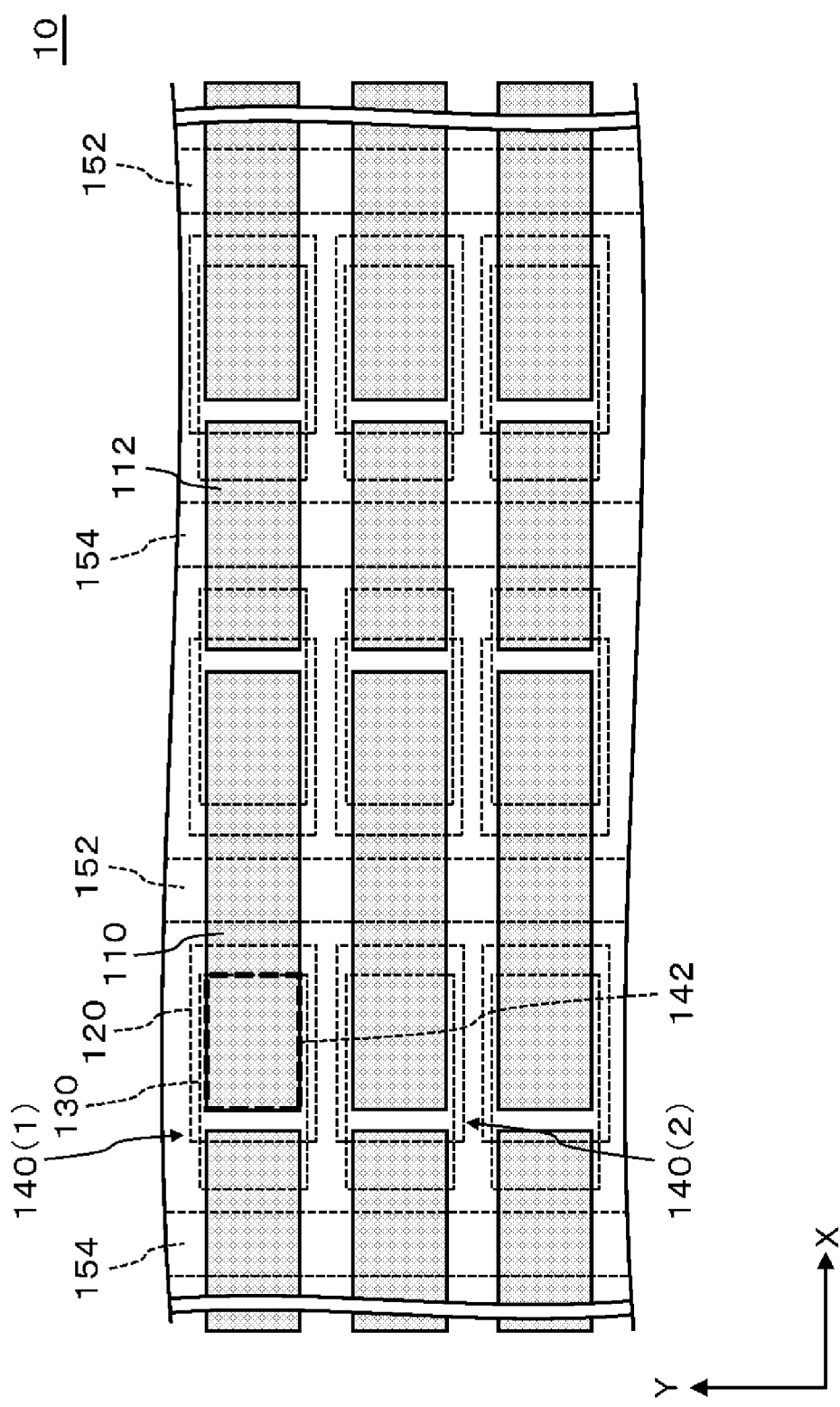
FIG. 10 is a view in which organic layers and bus electrodes are removed from FIG. 9.
Figure 11:
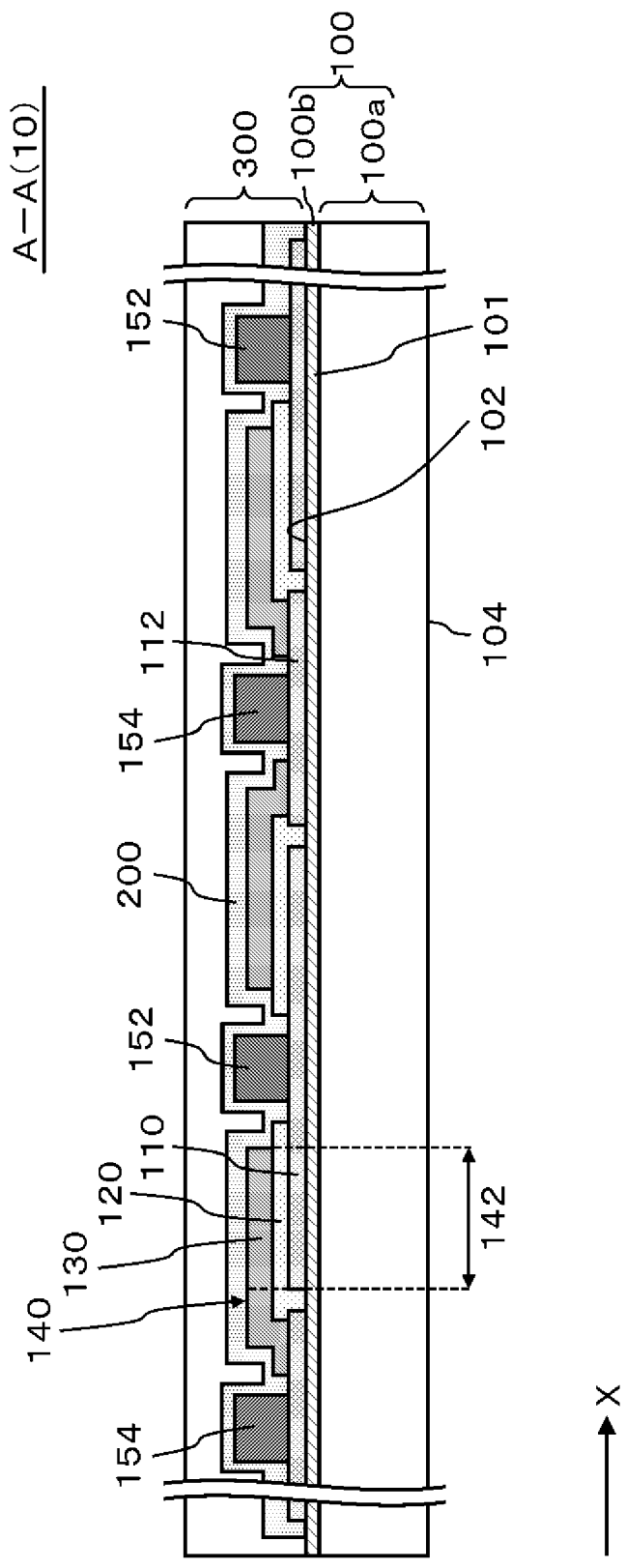
FIG. 11 is a cross-sectional view taken along line A-A in FIG. 8.

FIG. 8 is a plan view showing the light emitting device 10 according to a second embodiment, and corresponds to FIG. 1 of the first embodiment. FIG. 9 is a view in which the cathodes 130 are removed from FIG. 8 and corresponds to FIG. 2 of the first embodiment. FIG. 10 is a view in which the organic layers 120, bus electrodes 152, and bus electrodes 154 are removed from FIG. 9, and corresponds to FIG. 3 of the first embodiment. FIG. 11 is a cross-sectional view taken along a line A-A in FIG. 8, and corresponds to FIG. 4 of the first embodiment.

In the example shown in FIGS. 8 to 11, a plurality of light emitting portions 140 arranged in the Y direction is connected in parallel. By connecting the plurality of light emitting portions 140 in parallel, a range of non-light emitting region due to a dark spot can be limited to a limited range. More specifically, as will be described later with reference to FIG. 12, even if a dark spot occurs in any one of the light emitting portions 140 and this light emitting portion 140 is opened, current can flow through the light emitting portions 140 connected in parallel to the opened light emitting portion 140. That is, a range of a non-light emitting region due to a dark spot is limited to the opened light emitting portion 140.

Further, in the example shown in FIGS. 8 to 11, light emitting portions 140 adjacent along the X direction are not connected in series. By not connecting the light emitting portions 140 adjacent along the X direction in series, a range of a non-light emitting region due to a leakage is limited to a limited range. Specifically, as will be described later with reference to FIG. 13, even if a leak occurs in one of the light emitting portions 140 and this light emitting portion 140 is short-circuited, current can flow through the other of the light emitting portions 140. That is, a range of a non-light emitting region due to a leakage is limited to the short-circuited light emitting portion 140.

A plan layout of the light emitting device 10 will be described in detail with reference to FIGS. 8 to 10.

The bus electrode 152 and the bus electrode 154 are alternately arranged along the X direction. Between the bus electrode 152 and the bus electrode 154, a plurality of light emitting portions 140 is arranged in the Y direction. The plurality of light emitting portions 140 between the bus electrode 152 and the bus electrode 154 is connected in parallel.

In the examples shown in FIGS. 8 to 10, as shown in FIG. 10, the anodes 110 adjacent to each other in the Y direction are not connected and are spaced apart from each other. This can reduce the area of a region overlapping with the anodes 110, and can increase a light transmittance of the light emitting device 10.

Similarly, the conductive layers 112 adjacent in the Y direction are not connected and are spaced apart from each other. This can reduce the area of a region overlapping with the conductive layers 112, and can increase a light transmittance of the light emitting device 10.

With reference to FIG. 11, a cross-sectional structure of the light emitting device 10 will be described in detail.

The light emitting portions 140 adjacent to each other across the bus electrode 152 share the common anode 110 and are connected to the common bus electrode 152. This can reduce a gap between the light emitting portions 140 adjacent across the bus electrode 152.

The cathodes 130 of the light emitting portions 140 adjacent to each other across the bus electrode 154 are connected to the common bus electrode 152 through the common conductive layer 112. This can reduce a gap between the light emitting portions 140 adjacent across the bus electrode 154.

FIG. 12 is a view for explaining a first example of operations of the light emitting device 10 shown in FIGS. 8 to 11.

In the example shown in FIG. 12, four light emitting portions 140 are arranged in a matrix shape of two rows and two columns. Specifically, one bus electrode 152 is disposed between the two bus electrodes 154. Two of the four light emitting portions 140 are connected in parallel between the bus electrode 152 and one of the bus electrodes 154. The remaining two of the four light emitting portions 140 are connected in parallel between the bus electrode 152 and the other of the bus electrodes 154. A resistance of each light emitting portion 140 is R. A voltage of the bus electrode 152 and the bus electrode 154 is V.

Figure 12A:
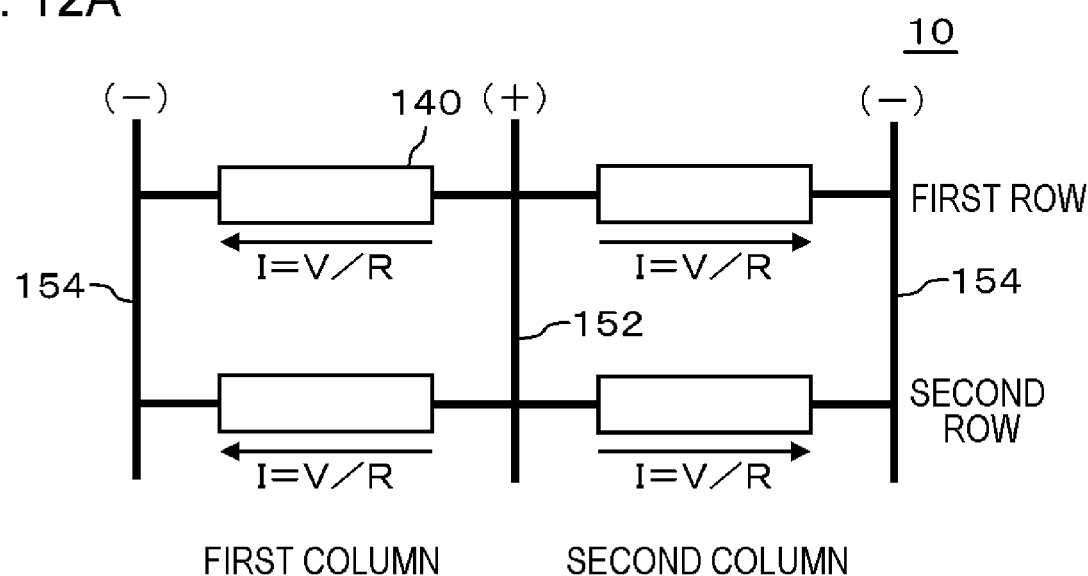
FIG. 12 is a view for explaining a first example of operations of the light emitting device shown in FIGS. 8 to 11.

In FIG. 12A, the light emitting device 10 operates normally. In particular, in the example shown in FIG. 12A, current I=V/R flows through each light emitting portion 140.

Figure 12B:
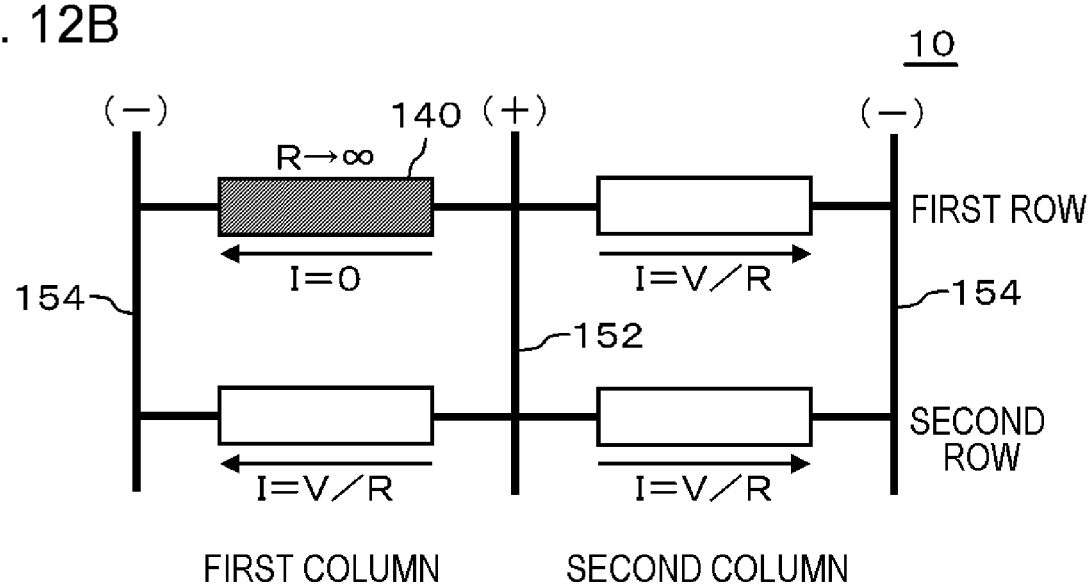

In FIG. 12B, a dark spot has occurred in a light emitting portion 140 located in a first row and a first column. Due to the occurrence of the dark spot, this light emitting portion 140 is opened. Although the current does not flow through the opened light emitting portion 140 due to the opening of the light emitting portion 140, the same current (V/R) as the current before the occurrence of a dark spot, flows through the other light emitting portions 140.

FIG. 13 is a view for explaining a second example of operations of the light emitting device 10 shown in FIGS. 8 to 11. The example shown in FIG. 13 is the same as the example shown in FIG. 12, except for the following points.

Figure 13A:
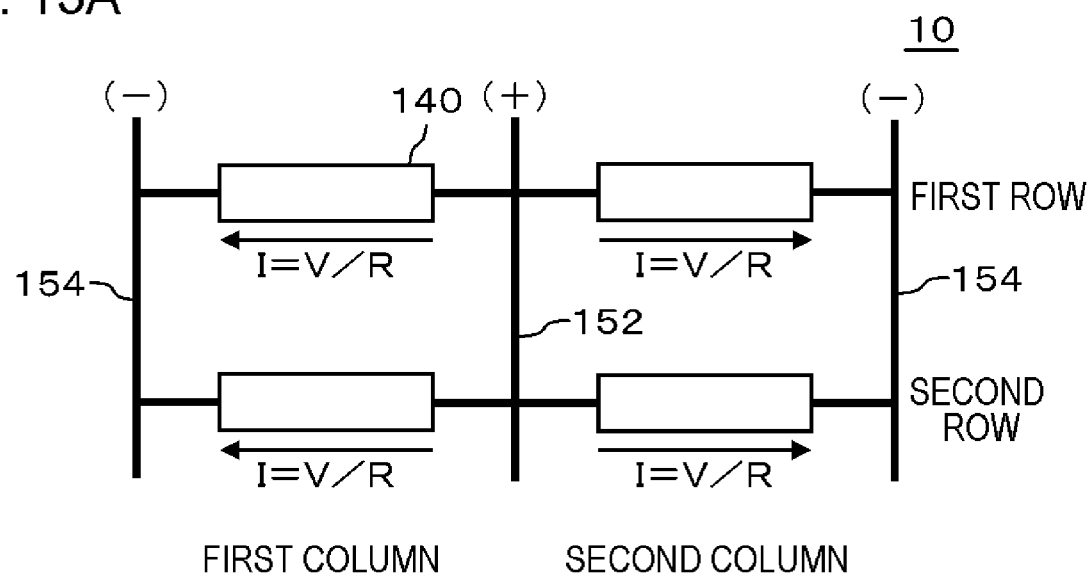
FIG. 13 is a view for explaining a second example of operations of the light emitting device shown in FIGS. 8 to 11.

In FIG. 13A, the light emitting device 10 operates normally. In particular, in the example shown in FIG. 13A, current I=V/R flows through each light emitting portion 140.

Figure 13B:
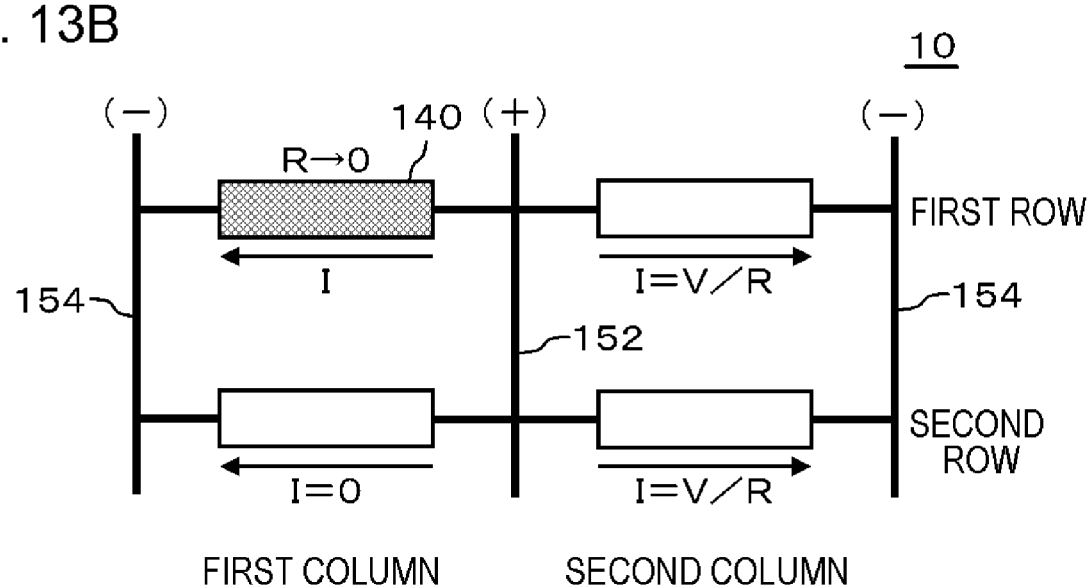

In FIG. 13B, a leakage has occurred in a light emitting portion 140 located in a first row and a first column. Due to the occurrence of the leakage, this light emitting portion 140 is short-circuited. Although the current does not flow to the light emitting portion 140 connected in parallel to the short-circuited light emitting portion 140 due to the short circuit of the light emitting portion 140, the same current (V/R) as the current before the occurrence of a leakage, flows through the light emitting portion 140 not connected in series to these light emitting portions 140.

Figure 14:
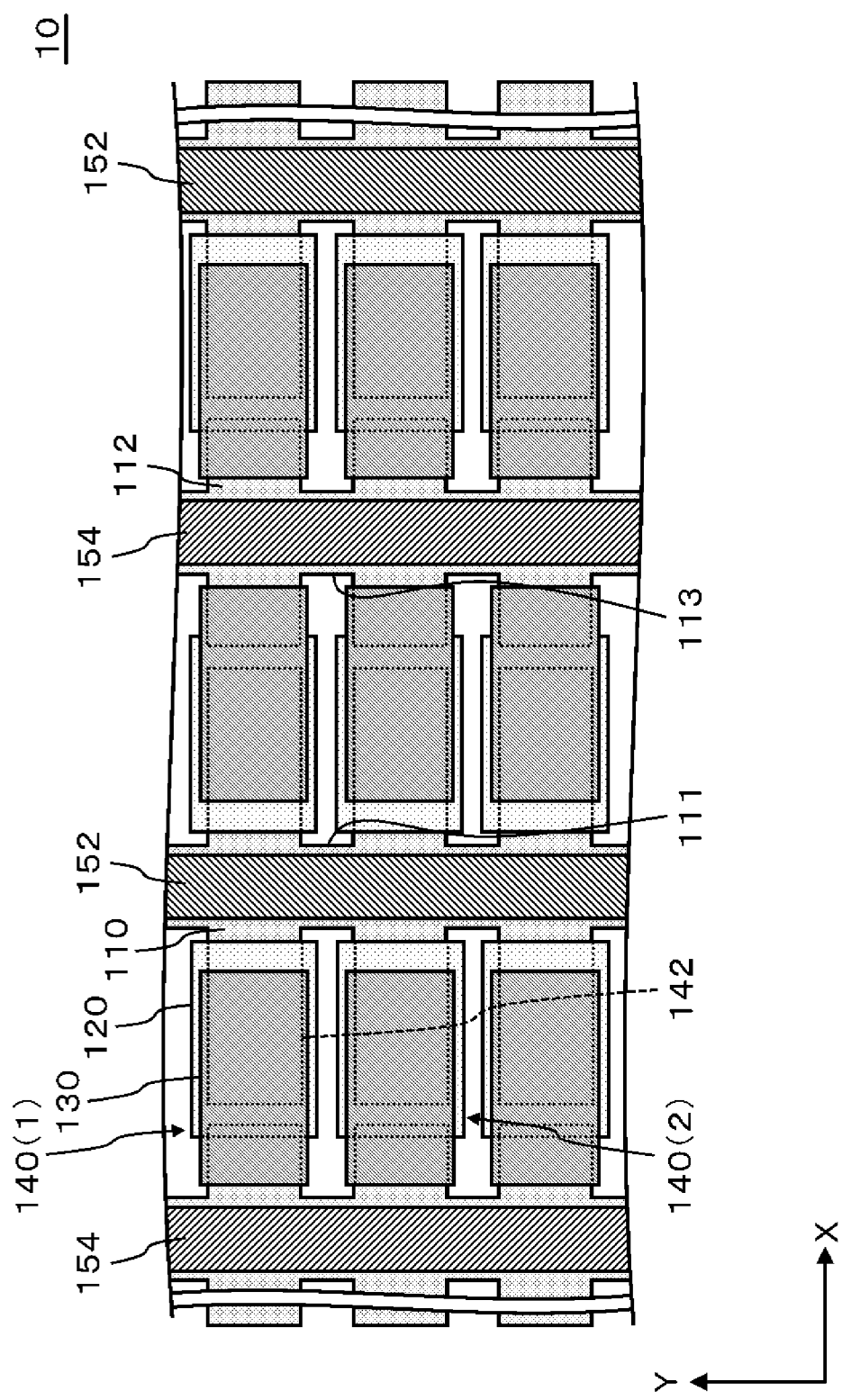
FIG. 14 is a view showing a modification example of FIG. 8.

FIG. 14 is a view showing a modification example of FIG. 8. The light emitting device 10 shown in FIG. 14 is the same as the light emitting device 10 shown in FIGS. 8 to 11 except for the following points.

The anodes 110 adjacent along the Y direction are connected to each other through the conductive layer 111. The conductive layer 111 contains the same material as the anode 110. Between the anodes 110 adjacent along the Y direction, the bus electrode 152 overlaps with the conductive layer 111. The bus electrode 152 has higher adhesion to the conductive layer 111 than to the substrate 100. This adhesion can prevent peeling of the bus electrode 152. In particular, in the example shown in FIG. 14, the width of the conductive layer 111 is wider than the width of the bus electrode 152, and the entire lower surface of the bus electrode 152 can be in contact with the conductive layer 111 between the anodes 110 adjacent along the Y direction. As a result, the bus electrode 152 can firmly adhere to the conductive layer 111.

The conductive layers 112 adjacent along the Y direction are connected to each other through the conductive layer 113. The conductive layer 113 contains the same material as the conductive layer 112. Between the conductive layers 112 adjacent along the Y direction, the bus electrode 154 overlaps with the conductive layer 113. The bus electrode 154 has higher adhesion to the conductive layer 113 than to the substrate 100. This adhesion can prevent peeling of the bus electrode 154. In particular, in the example shown in FIG. 14, the width of the conductive layer 113 is wider than the width of the bus electrode 154, and the entire lower surface of the bus electrode 154 can be in contact with the conductive layer 113 between the conductive layers 112 adjacent along the Y direction. As a result, the bus electrode 154 can firmly adhere to the conductive layer 113.

Third Embodiment

Figure 15:
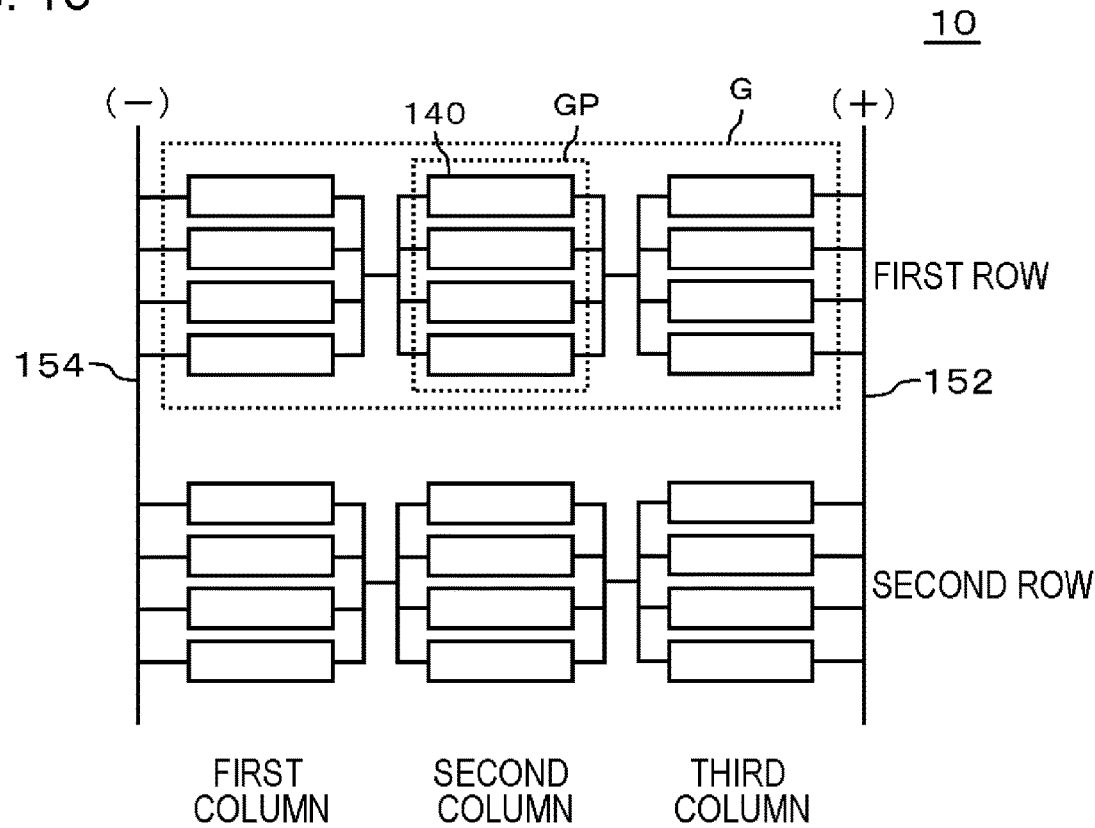
FIG. 15 is a circuit diagram showing a light emitting device according to a third embodiment.

FIG. 15 is a circuit diagram showing the light emitting device 10 according to a third embodiment. The light emitting device 10 according to the present embodiment is the same as the light emitting device 10 according to the first embodiment except for the following points.

The light emitting device 10 includes a plurality of groups G. Each group G includes a plurality of element groups GP connected in series. Each element group GP includes a plurality of light emitting portions 140 connected in parallel. In particular, in the example shown in FIG. 15, the light emitting device 10 includes two groups G. Each group G includes three element groups GP connected in series. Each element group GP includes four light emitting portions 140 connected in parallel.

By connecting the plurality of light emitting portions 140 in parallel inside each element group GP and connecting the plurality of element groups GP in series, a range of non-light emitting region due to a dark spot can be limited to a limited range. More specifically, as will be described later with reference to FIG. 16, even if a dark spot occurs in one light emitting portion 140 in any of the element groups GP and this light emitting portion 140 is opened, current can flow through the light emitting portions 140 connected in parallel to the opened light emitting portion 140 and the element group GP connected in series to the element group GP including the opened light emitting portion 140. That is, a range of a non-light emitting region due to a dark spot is limited to the opened light emitting portion 140.

Further, by connecting the plurality of light emitting portions 140 in parallel inside each element group GP and connecting each element group GP in series, a range of non-light emitting region due to a leakage can be limited to a limited range. More specifically, as will be described later with reference to FIG. 17, even if a leakage occurs in one light emitting portion 140 in any of the element groups GP and this light emitting portion 140 is short-circuited, current can flow through the element group GP connected in series to the element group GP including the short-circuited light emitting portion 140. That is, a range of a non-light emitting region due to the dark spot is limited to the short-circuited light emitting portion 140 and the light emitting portion 140 connected in parallel to the short-circuited light emitting portion 140.

FIG. 16 is a view for explaining a first example of operations of the light emitting device 10 shown in FIG. 15. A resistance of each light emitting portion 140 is R. A voltage of the bus electrode 152 and the bus electrode 154 is V.

Figure 16A:
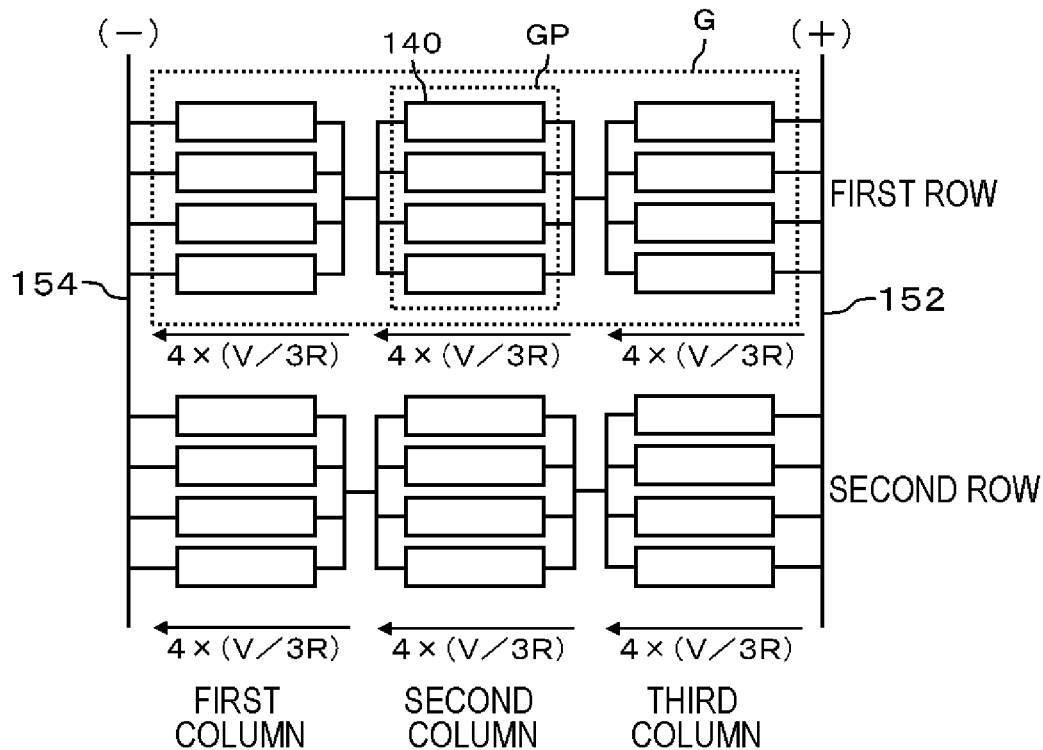
FIG. 16 is a view for explaining a first example of operations of the light emitting device shown in FIG. 15.

In FIG. 16A, the light emitting device 10 operates normally. In particular, in the example shown in FIG. 16A, current of V/3R flows through each light emitting portion 140.

Figure 16B:
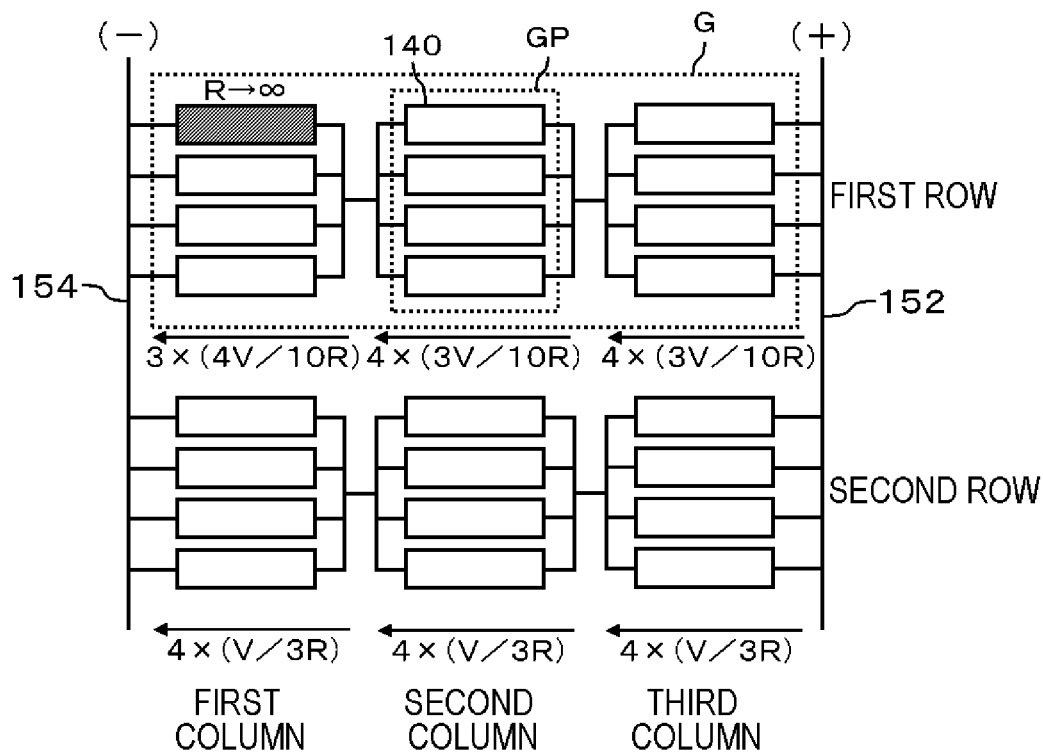

In FIG. 16B, a dark spot has occurred in one light emitting portion 140 in the element group GP located in a first row and a first column. Due to the dark spot, this light emitting portion 140 is opened. Although a combined resistance of the element group GP located in the first row and the first column increases due to the opening of the light emitting portion 140, current flows to each of the light emitting portions 140 except for the opened light emitting portion 140. Specifically, in the example shown in FIG. 16B, in the element group GP located in the first row and first column, current of 4V/10R flows through each of the three light emitting portions 140 except for the opened light emitting portion 140, and current of 3V/10R flows through each of the light emitting portions 140 in the respective element groups GP located in the first row and a second column, and the first row and a third column. On the other hand, the current flowing through the light emitting portions 140 located in the second row remains V/3R.

FIG. 17 is a view for explaining a second example of operations of the light emitting device 10 shown in FIG. 15. The example shown in FIG. 17 is the same as the example shown in FIG. 16, except for the following points.

Figure 17A:
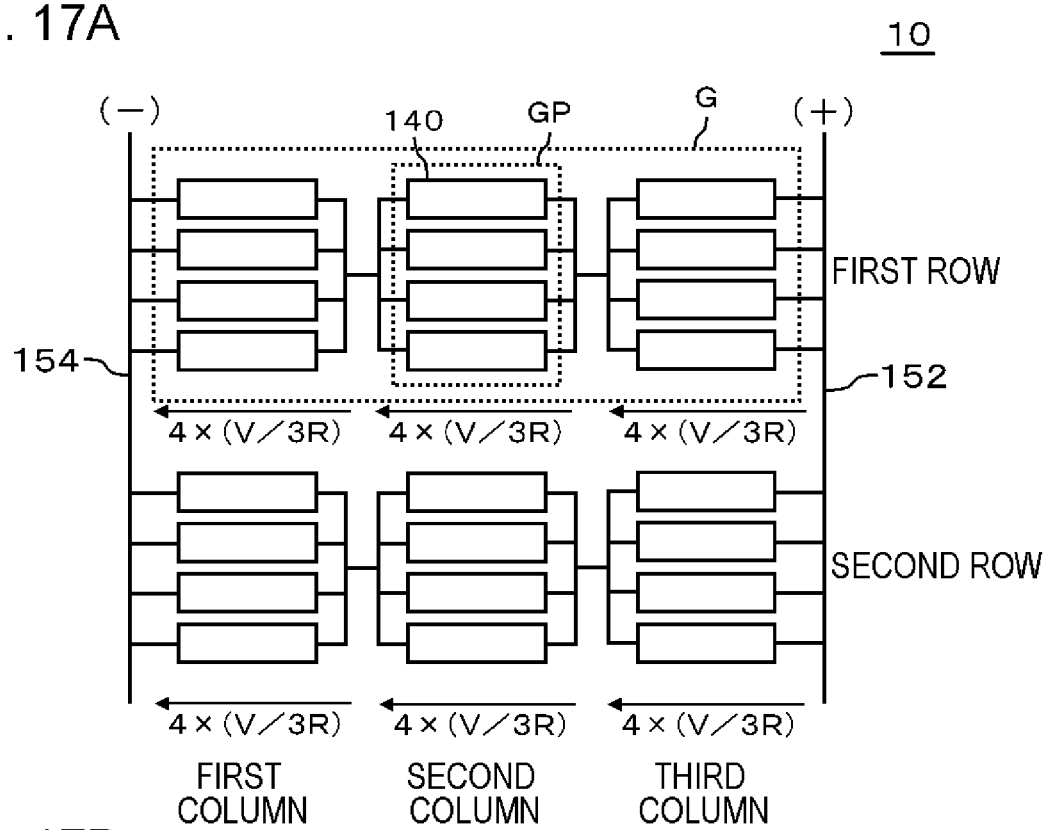
FIG. 17 is a view for explaining a second example of operations of the light emitting device shown in FIG. 15.

In FIG. 17A, the light emitting device 10 operates normally. In particular, in the example shown in FIG. 17A, current of V/3R flows through each light emitting portion 140.

Figure 17B:
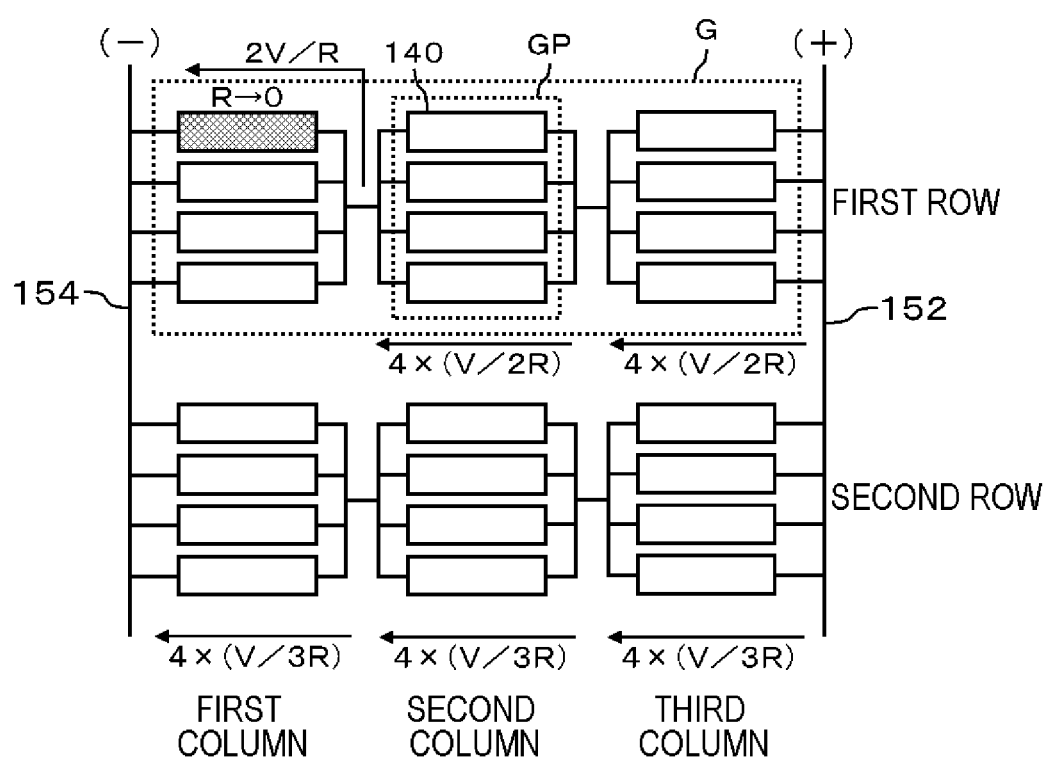

In FIG. 17B, a leakage has occurred in one light emitting portion 140 in the element group GP located in a first row and a first column. Due to the leakage, this light emitting portion 140 is short-circuited. Although the current flowing in the element group GP connected in series to the element group GP including the short-circuited light emitting portion 140 increases due to the short circuit of the light emitting portion 140, current flows through any of the light emitting portions 140 except for the light emitting portion 140 connected in parallel to the short-circuited light emitting portion 140. Specifically, in the example shown in FIG. 17B, in the respective element groups GP located in the first row and a second column, and the first row and a third column, current of V/2R flows through each of the light emitting portions 140. On the other hand, the current flowing through each of the light emitting portions 140 located in the second row remains V/3R.

Figure 18:
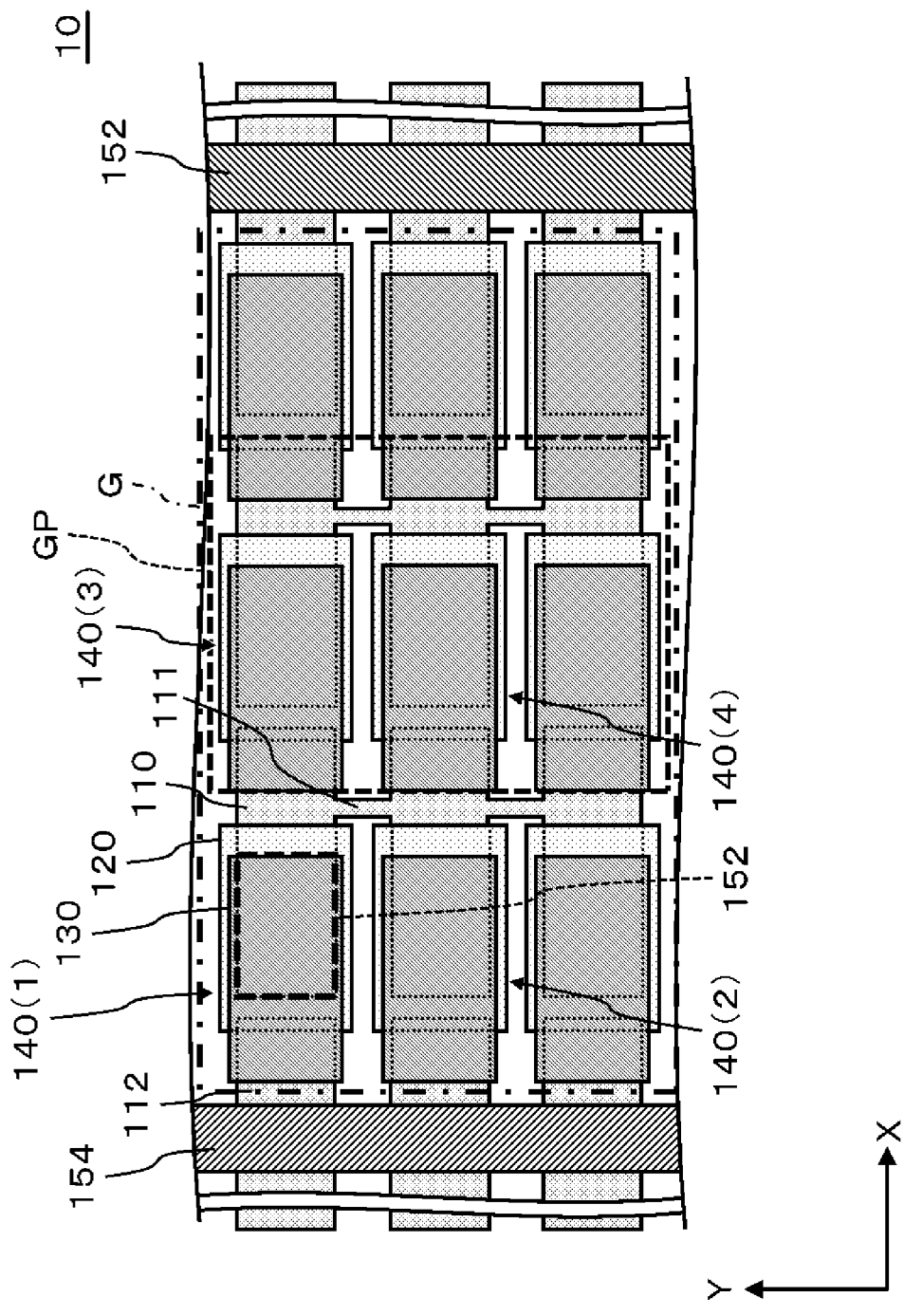
FIG. 18 is a plan view showing an example of a group of the light emitting device shown in FIG. 15.

FIG. 18 is a plan view showing an example of a group G of the light emitting device 10 shown in FIG. 15.

In the example shown in FIG. 18, the group G includes three element groups GP arranged in the X direction. Each element group GP includes three light emitting portions 140 arranged in the Y direction. Thus, the nine light emitting portions 140 are arranged in a two-dimensional matrix shape of three rows and three columns.

The three light emitting portions 140 inside each element group GP are connected in parallel. Specifically, except for the anode 110 connected to the bus electrode 152, the anodes 110 adjacent along the Y direction are connected to each other through the conductive layer 111. The conductive layer 111 contains the same material as the anode 110. The light emitting portion 140 of the element group GP adjacent to the bus electrode 152 is connected in parallel between the bus electrode 152 and the anode 110 of another element group GP at the bus electrode 154 side of the element group GP, the light emitting portion 140 of the element group GP adjacent to the bus electrode 154 is connected in parallel between the anode 110 of the element group GP and the bus electrode 154, and the light emitting portion 140 of the element group GP between these element groups GP is connected in parallel between the anode 110 of the element group GP and the anode 110 of another element group GP at the bus electrode 154 side of the element group GP.

Fourth Embodiment

Figure 19:
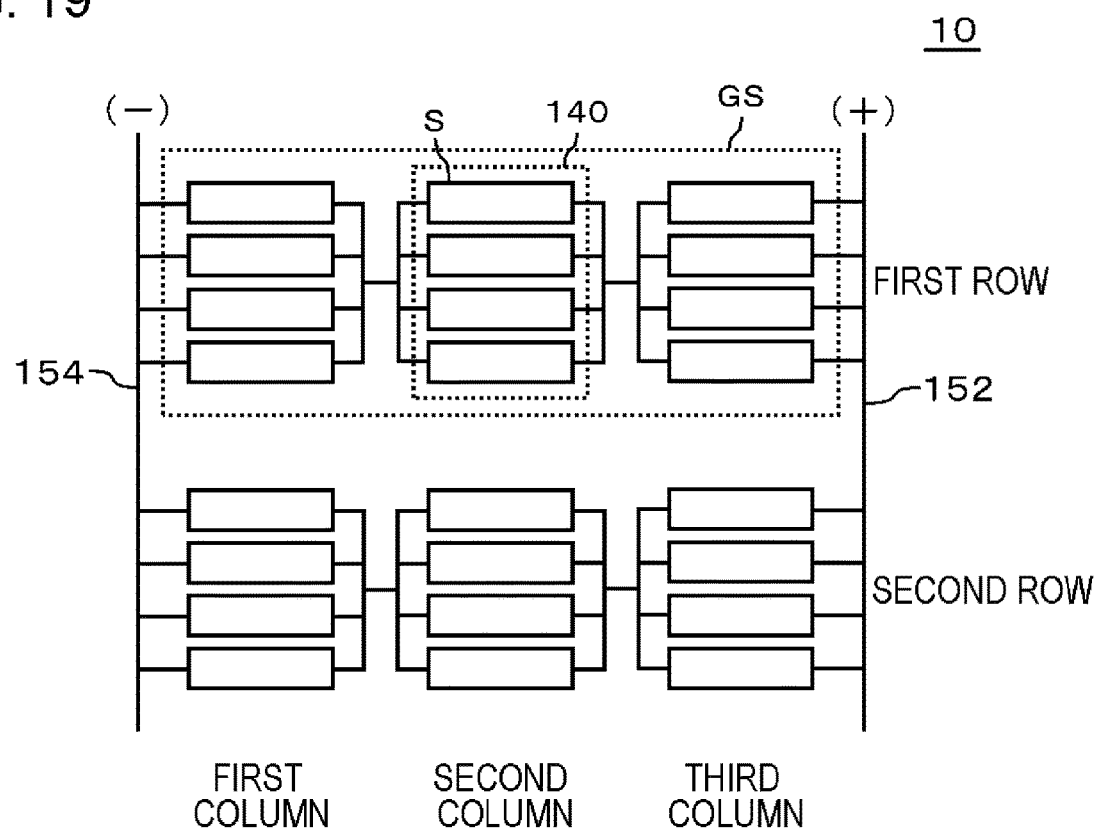
FIG. 19 is a circuit diagram showing a light emitting device according to a fourth embodiment.

FIG. 19 is a circuit diagram showing the light emitting device 10 according to a fourth embodiment, and corresponds to FIG. 15 of the third embodiment. The light emitting device 10 according to the present embodiment is the same as the light emitting device 10 according to the third embodiment except for the following points.

The light emitting device 10 includes a plurality of element groups GS. Each element group GS includes a plurality of light emitting portions 140 connected in series. Each light emitting portion 140 includes a plurality of sub-pixels S connected in parallel. In particular, in the example shown in FIG. 15, the light emitting device 10 includes two element groups GS. Each element group GS includes three light emitting portions 140 connected in series. Each light emitting portion 140 includes four sub-pixels S connected in parallel.

By connecting the plurality of sub-pixels S in parallel inside each light emitting portion 140 and connecting the plurality of light emitting portions 140 in series, a range of non-light emitting region due to a dark spot can be limited to a limited range. Specifically, similarly to the example described with reference to FIG. 16, even if a dark spot occurs in one sub-pixel S in any of the light emitting portions 140 and the one sub-pixel S is opened, current can flow through the sub-pixel S connected in parallel to the opened sub-pixel S and the light emitting portion 140 connected in series to the light emitting portion 140 including the opened sub-pixel S. That is, a range of a non-light emitting region due to the dark spot is limited to the opened sub-pixel S.

Further, by connecting the plurality of sub-pixels S in parallel inside each light emitting portion 140 and connecting the light emitting portions 140 in series, a range of non-light emitting region due to a leakage can be limited to a limited range. Specifically, similarly to the example described with reference to FIG. 17, even if a leakage occurs in one sub-pixel S in any of the light emitting portions 140 and the one sub-pixel S is short-circuited, current can flow through the light emitting portion 140 connected in series to the light emitting portion 140 including the short-circuited sub-pixel S. That is, a range of a non-light emitting region due to a dark spot is limited to the short-circuited sub-pixel S and the sub-pixel S connected in parallel to the short-circuited sub-pixel S.

Figure 20:
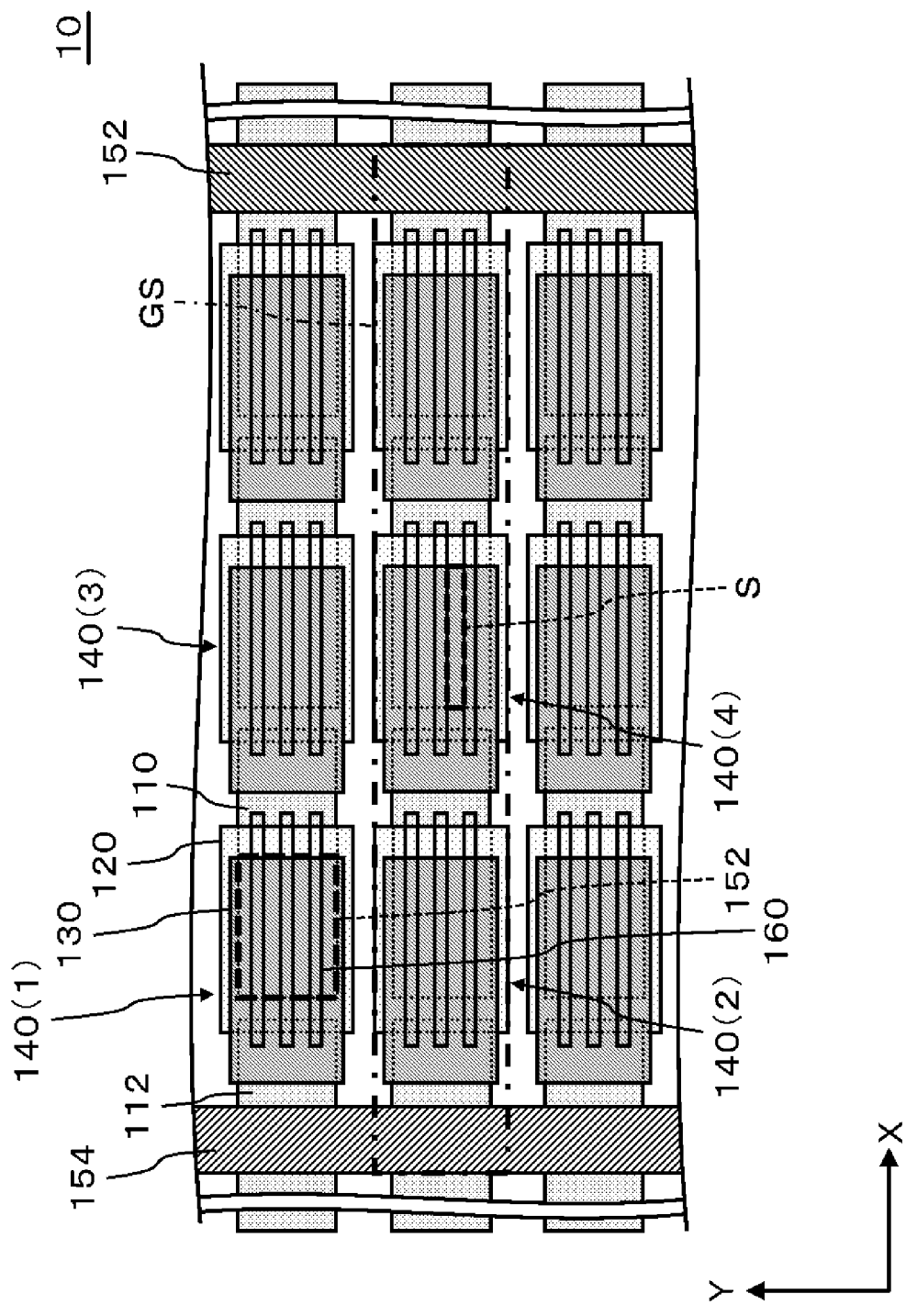
FIG. 20 is a plan view showing an example of the light emitting device shown in FIG. 19.
Figure 21:
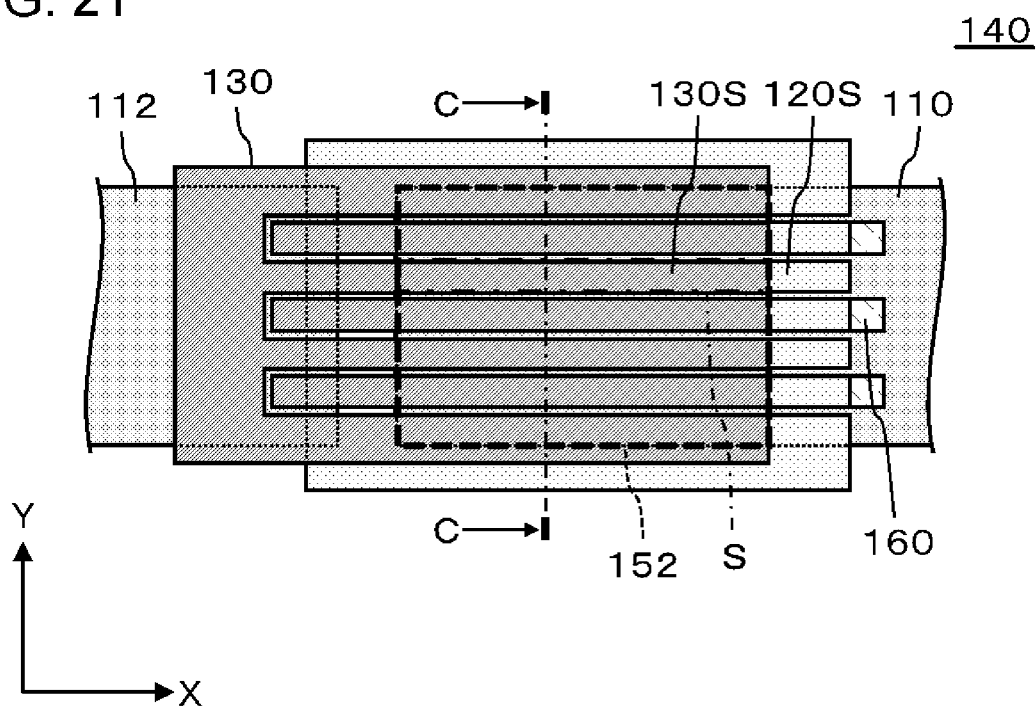
FIG. 21 is an enlarged view of a light emitting portion shown in FIG. 20.
Figure 22:
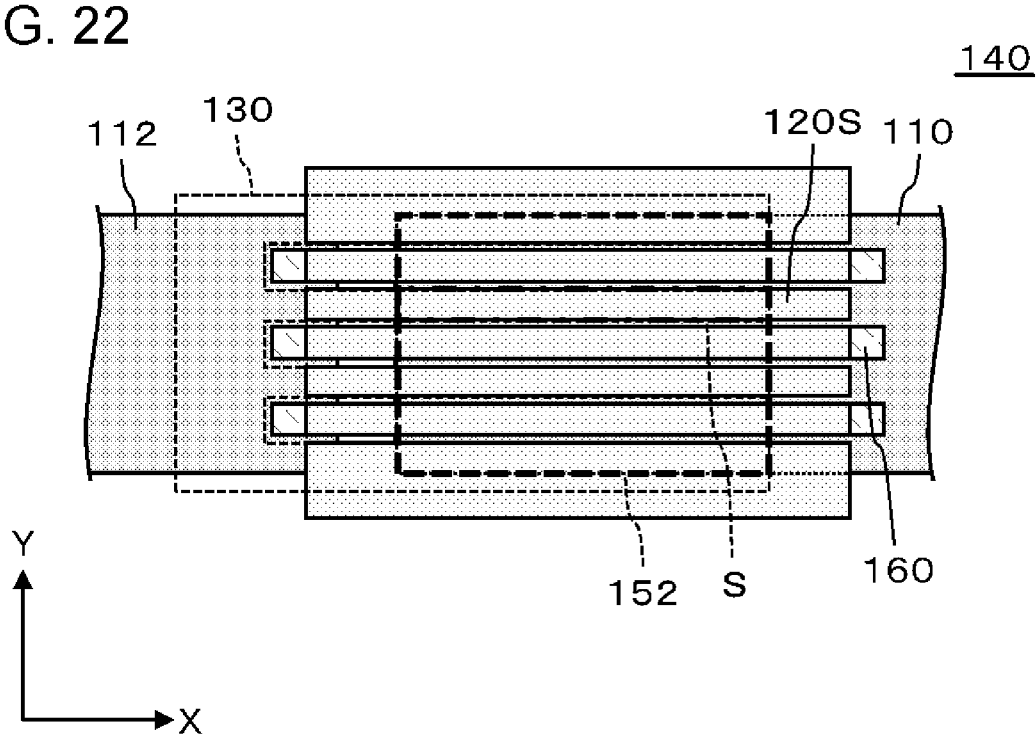
FIG. 22 is a view in which cathodes are removed from FIG. 21.
Figure 23:
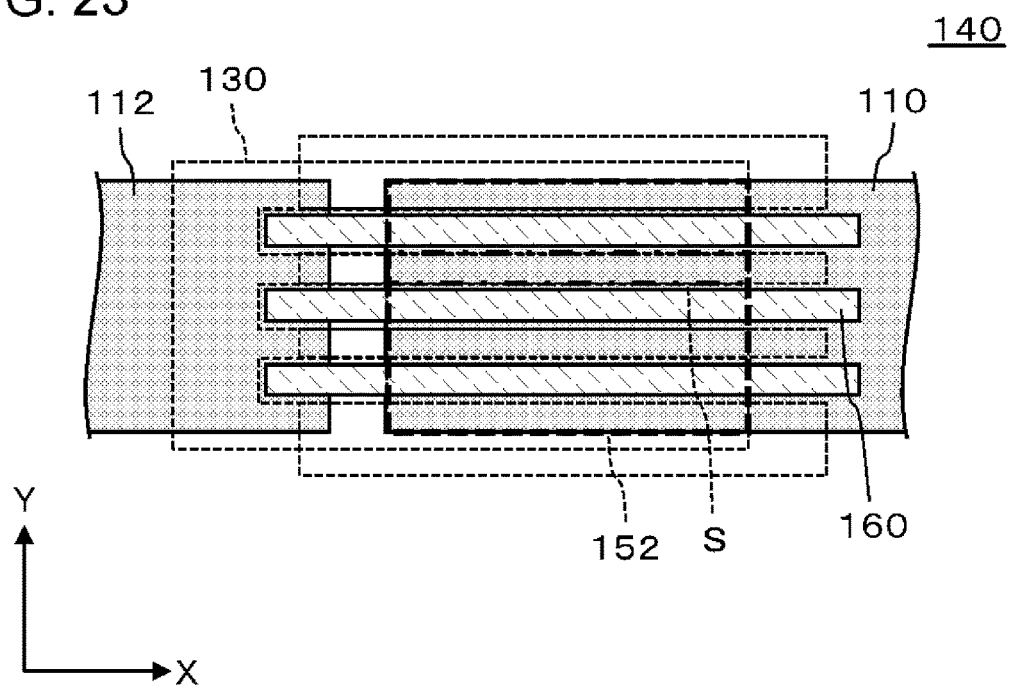
FIG. 23 is a view in which organic layers are removed from FIG. 22.
Figure 24:
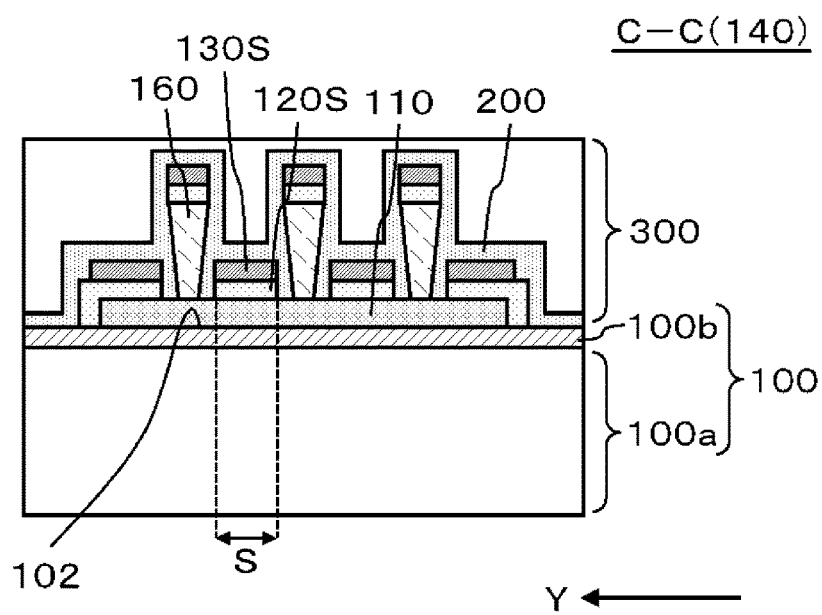
FIG. 24 is a cross-sectional view taken along line C-C in FIG. 21.

FIG. 20 is a plan view showing an example of the light emitting device 10 shown in FIG. 19. FIG. 21 is an enlarged view of the light emitting portion 140 shown in FIG. 20. FIG. 22 is a view in which a cathode 130 is removed from FIG. 21. FIG. 23 is a view in which an organic layer 120 is removed from FIG. 22. FIG. 24 is a cross-sectional view taken along a line C-C in FIG. 21.

In the example shown in FIG. 20, three element groups GS arranged in the X direction are included. Each element group GS includes three light emitting portions 140 arranged in the Y direction. Each of the light emitting portions 140 includes four sub-pixels S arranged in the Y direction. Thus, the nine light emitting portions 140 are arranged in a two-dimensional matrix shape of three rows and three columns.

Details of the light emitting portion 140 will be described with reference to FIGS. 21 to 24. The light emitting portion 140 includes an anode 110, an organic layer 120, a cathode 130, and a plurality of partition walls 160.

As shown in FIGS. 21 to 23, the plurality of light emitting portions 140 is arranged in the Y direction and extended along the X direction. As shown in FIG. 24, a side wall of the partition wall 160 is inclined toward the outside of the partition wall 160 from the lower end to the upper end of the partition wall 160. The partition wall 160 contains an organic insulating material, for example, a polyimide.

The organic layer 120 is divided into a plurality of sub organic layers 120S by a plurality of partition walls 160. The plurality of sub organic layers 120S is not connected with each other and are spaced apart from each other. This prevents moisture intruding into one sub organic layer 120S from propagating to another sub organic layer 120S.

The cathode 130 has a plurality of sub cathodes 130S. The adjacent sub cathodes 130S are isolated from each other by the partition wall 160. This prevents moisture intruding into one sub cathode 130S from propagating to another sub cathode 130S. In the examples shown in FIGS. 21 to 23, the plurality of sub cathodes 130S is connected to each other at the conductive layer 112 side.

The light emitting portion 140 has a plurality of sub-pixels S. The adjacent sub-pixels S are isolated from each other by the partition wall 160. In the sub-pixel S, the anode 110, the sub organic layer 120S and the sub cathode 130S are overlapped, and a light is emitted from the sub organic layer 120S by a voltage between the anode 110 and the sub cathode 130S.

The inorganic layer 200 covers the anode 110, the plurality of sub organic layers 120S, the plurality of sub cathodes 130S, and the plurality of partition walls 160. In particular, in the example shown in FIG. 24, the inorganic layer 200 is an ALD film (that is, a film formed by ALD) and has excellent step coverage. This step coverage enables the inorganic layer 200 to cover even the inclined side wall of the partition wall 160.

Next, an example of a method of manufacturing the light emitting portion 140 shown in FIGS. 21 to 24 will be described.

First, the anode 110 is formed on the first surface 102 of the substrate 100.

Next, the partition wall 160 is formed. The partition wall 160 can be formed by patterning using a photolithography.

Next, the organic layer 120 is deposited. The organic layer 120 is divided into a plurality of sub organic layers 120S by the partition walls 160. Note that as shown in FIG. 24, a part of the organic layer 120 is also deposited on an upper surface of the partition wall 160.

Next, the cathode 130 is deposited. By the partition wall 160, the cathode 130 has sub cathodes 130S divided from each other. Note that as shown in FIG. 24, a part of the cathode 130 is also deposited on an upper surface of the partition wall 160.

Next, the inorganic layer 200 and the protective layer 300 are formed.

Thus, the light emitting portion 140 shown in FIGS. 21 to 24 is manufactured.

Fifth Embodiment

Figure 25A:
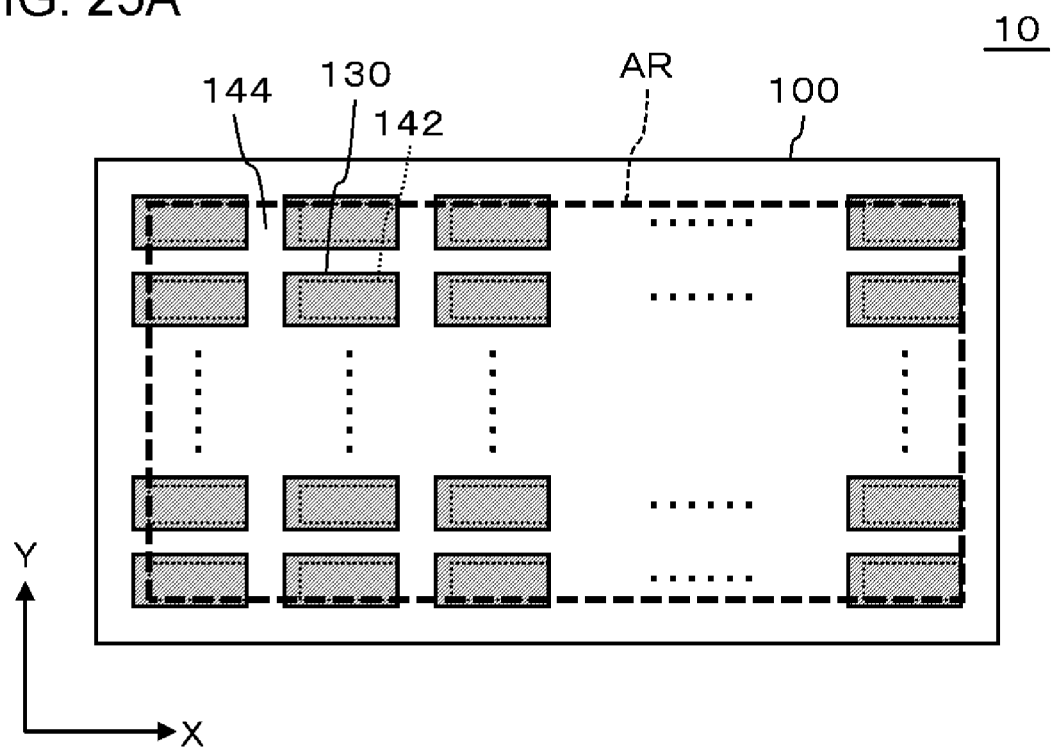
FIG. 25A is a plan view showing a light emitting device according to a fifth embodiment.
Figure 25B:
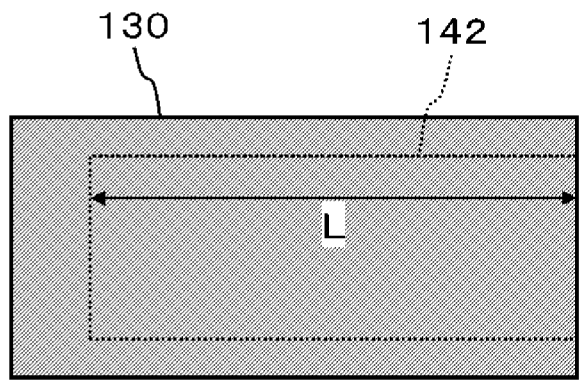
FIG. 25B is an enlarged view of a pixel shown in FIG. 25A.

FIG. 25A is a plan view showing the light emitting device 10 according to a fifth embodiment. FIG. 25B is an enlarged view of the pixel 142 shown in FIG. 25A. The light emitting device 10 according to the present embodiment is the same as the light emitting device 10 according to any one of the first embodiment to the fourth embodiment.

As shown in FIG. 25A, the light emitting device 10 has an active region AR (light emitting region). In the example shown in FIG. 25A, the shape of the active region AR is rectangular. The active region AR has a plurality of pixels 142 and a light transmitting portion 144. The light transmitting portion 144 is a region that does not overlap the light shielding member, more specifically, the cathode 130. That is, the light transmitting portion 144 includes a region between the pixels 142 adjacent along the X direction and a region between the pixels 142 adjacent along the Y direction.

When it is necessary for the light emitting device 10 to have a light transmitting property, it is preferable that an area of the plurality of cathodes 130 is 50% or less of the entire area of the active region AR.

As shown in FIG. 25B, the pixel 142 has a long length direction and a short length direction. Particularly, in the example shown in FIG. 25B, the pixel 142 is a rectangle having long sides and short sides. It is preferable that the length L of the pixel 142 in the long length direction is short, specifically, for example, it is preferably 1 mm or less. If the length L of the pixel 142 in the long length direction is short, even if the pixel 142 cannot emit a light due to a dark spot or a leakage, the non-light emitting region can be made inconspicuous.

Embodiments and examples have been described with reference to the drawings, these are examples of the present invention, and various configurations other than those described above can also be adopted.

This application claims priority based on Japanese Patent Application No. 2016-241026 filed on Dec. 13, 2016, the disclosure of which is incorporated herein in its entirety.

The invention claimed is:

1. A light emitting device comprising:
a substrate;
a first light emitting portion located over the substrate, the first light emitting portion comprising a first anode, a first cathode, and a first organic layer between the first anode and the first cathode;
a second light emitting portion located over the substrate, the second light emitting portion comprising a second anode, a second cathode spaced apart from the first cathode, and a second organic layer between the second anode and the second cathode, the second organic layer being spaced apart from the first organic layer;
a first conductive layer connected to the first cathode;
a second conductive layer connected to the second cathode;
a conductive layer connected to the first conductive layer and the second conductive layer; and
an inorganic layer continuously covering the first light emitting portion, the second light emitting portion, and the conductive layer, the inorganic layer being in contact with the first conductive layer between the first cathode and the conductive layer,
wherein the first organic layer comprises a first portion covering a side wall of the first anode at a side closest to the second light emitting portion,
wherein the second organic layer comprises a second portion covering a side wall of the second anode at a side closest to the first light emitting portion,
wherein the inorganic layer is in contact with the substrate between the first portion of the first organic layer and the second portion of the second organic layer.

2. The light emitting device according to claim 1, wherein the first light emitting portion and the second light emitting portion are connected in parallel.

3. The light emitting device according to claim 1, wherein the first conductive layer comprises a region overlapping with the conductive layer, and
wherein the conductive layer is covered with the inorganic layer opposite to the region of the first conductive layer.

4. The light emitting device according to claim 1, wherein the first conductive layer comprises a region overlapping with the first cathode, and
wherein the first cathode is covered with the inorganic layer opposite to the region of the first conductive layer.

5. The light emitting device according to claim 1, wherein the first conductive layer comprises a same material as a material of the first anode.

6. The light emitting device according to claim 1, further comprising:
a third light emitting portion comprising a third organic layer between a third anode spaced apart from the first anode and a third cathode connected to the first anode.

7. The light emitting device according to claim 1, wherein the first organic layer spreads over the first anode and the first conductive layer, and is in contact with the first conductive layer.

8. The light emitting device according to claim 1, further comprising:
a third conductive layer connected to the first anode and the second anode, and comprising a same material as material of the first anode and the second anode.

9. The light emitting device according to claim 1, wherein the first light emitting portion comprises a partition wall and a plurality of sub-pixels isolated from each other by the partition wall, and
wherein the inorganic layer covers each of the plurality of sub-pixels.

10. The light emitting device according to claim 1, further comprising:
a fourth conductive layer connected to the first conductive layer and the second conductive layer, and comprising a same material as material of the first conductive layer and the second conductive layer.

11. The light emitting device according to claim 1, wherein the first conductive layer and the second conductive layer are spaced apart from each other.

12. The light emitting device according to claim 1, wherein the inorganic layer is an ALD film.

13. The light emitting device according to claim 1, wherein a pixel of the first light emitting portion has a long length direction and a short length direction, and
wherein a length of the pixel of the first light emitting portion in the long length direction is 1 mm or less.

14. The light emitting device according to claim 1, further comprising:
a first light transmitting portion between the first light emitting portion and the second light emitting portion.

15. The light emitting device according to claim 6, further comprising:
a second light transmitting portion between the first light emitting portion and the third light emitting portion.

16. The light emitting device according to claim 1, further comprising:
an active region comprising a plurality of light emitting portions comprising the first light emitting portion and the second light emitting portion, and a light transmitting portion,
wherein the active region comprises a plurality of cathodes comprising the first cathode and the second cathode, and
wherein an area of the plurality of cathodes is 50% or less of an entire area of the active region.

* * * * *